United States Patent
Yoo et al.

(10) Patent No.: US 10,243,123 B2
(45) Date of Patent: Mar. 26, 2019

(54) LIGHT-EMITTING DIODE (LED), LED PACKAGE AND APPARATUS INCLUDING THE SAME

(71) Applicant: Samsung Electronics Co., Ltd., Suwon-si, Gyeonggi-do (KR)

(72) Inventors: Ha-nul Yoo, Goyang-si (KR); Yong-il Kim, Seoul (KR); Nam-goo Cha, Hwaseong-si (KR); Wan-tae Lim, Suwon-si (KR); Kyung-wook Hwang, Hwaseong-si (KR); Sung-hyun Sim, Uiwang-si (KR); Hye-seok Noh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/705,069

(22) Filed: Sep. 14, 2017

(65) Prior Publication Data

US 2018/0013042 A1    Jan. 11, 2018

Related U.S. Application Data

(63) Continuation of application No. 15/201,384, filed on Jul. 1, 2016, now Pat. No. 9,799,809.

(30) Foreign Application Priority Data

Aug. 26, 2015    (KR) .................. 10-2015-0120547

(51) Int. Cl.
*H01L 25/075* (2006.01)
*H01L 33/00* (2010.01)
(Continued)

(52) U.S. Cl.
CPC .......... *H01L 33/60* (2013.01); *H01L 25/0753* (2013.01); *H01L 33/06* (2013.01);
(Continued)

(58) Field of Classification Search
CPC . H01L 25/0753; H01L 25/167; H01L 33/502; H01L 33/145; H01L 33/06;
(Continued)

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |

(Continued)

FOREIGN PATENT DOCUMENTS

KR    20120077187    7/2012

*Primary Examiner* — Nikolay Yushin
(74) *Attorney, Agent, or Firm* — Renaissance IP Law Group LLP

(57) ABSTRACT

A light-emitting diode (LED) package includes a light-emitting structure, an optical wavelength conversion layer on the light-emitting structure, and an optical filter layer on the optical wavelength conversion layer. The light-emitting structure includes a first-conductivity-type semiconductor layer, an active layer on the first-conductivity-type semiconductor layer, and a second-conductivity-type semiconductor layer on the active layer, and emits first light having a first peak wavelength. The optical wavelength conversion layer absorbs the first light emitted from the light-emitting structure and emits second light having a second peak wavelength different from the first peak wavelength. The optical filter layer reflects the first light emitted from the light-emitting structure and transmits the second light emitted from the optical wavelength conversion layer.

20 Claims, 23 Drawing Sheets

(51) Int. Cl.
*H01L 33/60* (2010.01)
*H01L 33/06* (2010.01)
*H01L 33/14* (2010.01)
*H01L 33/32* (2010.01)
*H01L 33/50* (2010.01)
*H01L 33/38* (2010.01)
*H01L 33/44* (2010.01)

(52) U.S. Cl.
CPC ............ *H01L 33/145* (2013.01); *H01L 33/32* (2013.01); *H01L 33/38* (2013.01); *H01L 33/44* (2013.01); *H01L 33/50* (2013.01); *H01L 33/502* (2013.01); *H01L 2224/48227* (2013.01); *H01L 2224/48237* (2013.01); *H01L 2224/48247* (2013.01); *H01L 2224/48257* (2013.01); *H01L 2224/48465* (2013.01); *H01L 2224/73265* (2013.01); *H01L 2924/181* (2013.01)

(58) Field of Classification Search
CPC ......... H01L 33/60; H01L 33/38; H01L 33/50; H01L 33/44; H01L 33/32; H01L 2224/48237; H01L 2224/48247; H01L 2224/48257; H01L 2224/73265; H01L 2224/48465; H01L 2224/48227; H01L 2924/181; H01L 25/0657
See application file for complete search history.

(56) References Cited

U.S. PATENT DOCUMENTS

| | | | |
|---|---|---|---|
| 6,686,676 B2 | 2/2004 | McNulty et al. | |
| RE38,466 E | 3/2004 | Inoue et al. | |
| 6,775,439 B2 * | 8/2004 | Takano | G02B 6/12007 385/129 |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,940,101 B2 | 9/2005 | Yano et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,350,933 B2 | 4/2008 | Ng et al. | |
| 7,402,840 B2 | 7/2008 | Krames et al. | |
| 7,495,375 B2 | 2/2009 | Huang et al. | |
| 7,501,656 B2 | 3/2009 | Han et al. | |
| 7,554,126 B2 * | 6/2009 | Higashi | H01L 33/38 257/79 |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,114,692 B2 | 2/2012 | Krames | |
| 8,129,711 B2 | 3/2012 | Kang et al. | |
| 8,138,671 B2 | 3/2012 | Hildenbrand et al. | |
| 8,169,135 B2 | 5/2012 | Zhai et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,368,114 B2 | 2/2013 | Yang | |
| 8,399,944 B2 | 3/2013 | Kwak et al. | |
| 8,432,511 B2 | 4/2013 | Jeong | |
| 8,459,814 B2 * | 6/2013 | Su | H01L 33/46 257/96 |
| 8,459,832 B2 | 6/2013 | Kim | |
| 8,492,746 B2 | 7/2013 | Yen | |
| 8,502,242 B2 | 8/2013 | Kim | |
| 8,536,604 B2 | 9/2013 | Kwak et al. | |
| 8,556,438 B2 | 10/2013 | McKenzie et al. | |
| 8,674,734 B2 | 3/2014 | Jung | |
| 8,704,254 B2 | 4/2014 | Trottier et al. | |
| 8,735,931 B2 | 5/2014 | Han et al. | |
| 8,766,295 B2 | 7/2014 | Kim | |
| 8,916,890 B2 | 12/2014 | Chakraborty | |
| 9,024,335 B2 | 5/2015 | Do et al. | |
| 9,112,121 B2 * | 8/2015 | Jung | H01L 33/50 |
| 9,423,832 B2 * | 8/2016 | Jeoung | G06F 1/1652 |
| 9,425,359 B2 | 8/2016 | Tsai et al. | |
| 9,634,191 B2 * | 4/2017 | Keller | H01L 33/385 |
| 9,837,388 B2 * | 12/2017 | Rhee | H01L 25/0753 |
| 2002/0180351 A1 | 12/2002 | McNulty et al. | |
| 2003/0095744 A1 * | 5/2003 | Takano | G02B 6/12007 385/24 |
| 2007/0064407 A1 | 3/2007 | Huang et al. | |
| 2007/0262338 A1 * | 11/2007 | Higashi | H01L 33/38 257/99 |
| 2009/0121241 A1 * | 5/2009 | Keller | H01L 33/385 257/96 |
| 2010/0277887 A1 * | 11/2010 | Su | H01L 33/44 362/19 |
| 2011/0012141 A1 | 1/2011 | Toquin et al. | |
| 2011/0156071 A1 | 6/2011 | Cheng et al. | |
| 2013/0062592 A1 | 3/2013 | Yen | |
| 2013/0087821 A1 | 4/2013 | Do et al. | |
| 2013/0299865 A1 | 11/2013 | Bechtel et al. | |
| 2013/0308309 A1 | 11/2013 | Schubert et al. | |
| 2013/0313585 A1 * | 11/2013 | Jung | H01L 33/50 257/89 |
| 2014/0185299 A1 | 7/2014 | Sanga et al. | |
| 2015/0034990 A1 | 2/2015 | Roitman et al. | |
| 2015/0108526 A1 | 4/2015 | Tsai et al. | |
| 2015/0162503 A1 | 6/2015 | Bechtel et al. | |
| 2015/0255505 A1 * | 9/2015 | Jeoung | G06F 1/1652 257/89 |
| 2016/0190105 A1 * | 6/2016 | Rhee | H01L 25/0753 257/76 |

\* cited by examiner

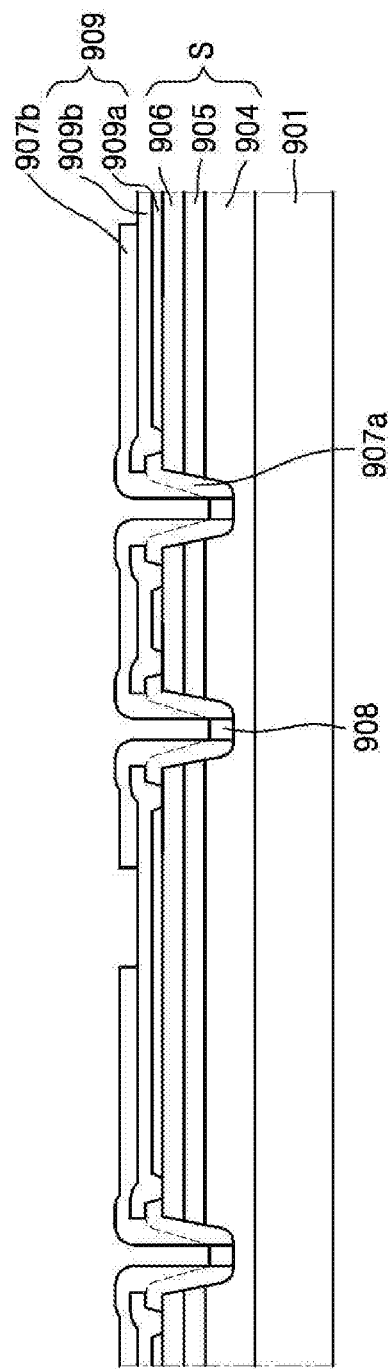

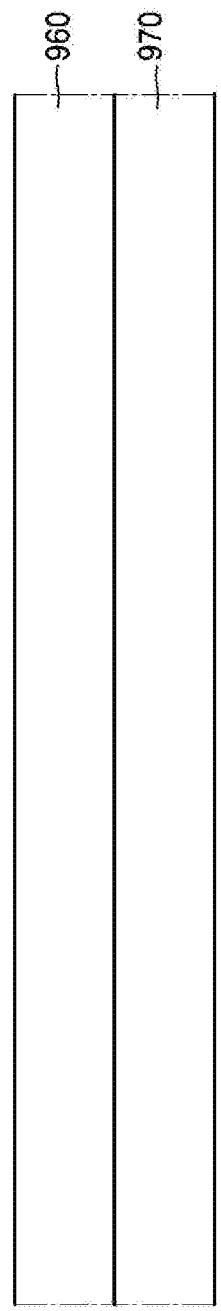

LIGHT-EMITTING DIODE (LED), LED PACKAGE AND APPARATUS INCLUDING THE SAME

CROSS-REFERENCE TO RELATED APPLICATION

This U.S. non-provisional patent application is a continuation of U.S. patent application Ser. No. 15/201,384, filed on Jul. 1, 2016, which application claims the benefit of Korean Patent Application No. 10-2015-0120547, filed on Aug. 26, 2015, in the Korean Intellectual Property Office, the disclosure of which is incorporated herein in its entirety by reference.

BACKGROUND

The inventive concept relates to a light-emitting diode (LED), LED package and an apparatus including the same, and more particularly, an LED package capable of emitting light of a second color by using an LED that emits light of a first color, and a three-color light-emitting apparatus and a display device including the LED.

LED packages may be used for small household appliances, interior products, and display devices such as electronic boards. In order to enable the LED packages to be used for the display devices, the LED packages must be able to display three primary colors. However, in the case of a package using LEDs of different colors, the configuration of a display device becomes complicated due to different operating voltages and power consumption increases.

SUMMARY

The inventive concept provides a light-emitting diode (LED), an LED package capable of emitting light of a second color by using an LED that emits light of a first color.

In one embodiment, the inventive concept provides a three-color light-emitting apparatus and a display device including an LED.

According to an aspect of the inventive concept, there is provided an LED including: a light-emitting structure including a first-conductivity-type semiconductor layer, an active layer on the first-conductivity-type semiconductor layer, and a second-conductivity-type semiconductor layer on the active layer, and configured to emit first light having a first peak wavelength; an optical wavelength conversion layer disposed on the light-emitting structure and configured to absorb the first light emitted from the light-emitting structure and emit second light having a second peak wavelength different from the first peak wavelength; and an optical filter layer disposed on the optical wavelength conversion layer and configured to reflect the first light emitted from the light-emitting structure and transmit the second light emitted from the optical wavelength conversion layer.

The optical wavelength conversion layer may be disposed between the light-emitting structure and the optical filter layer.

The first peak wavelength may be included in a wavelength band of blue visible light or a wavelength band of ultraviolet light.

The second peak wavelength may be included in a wavelength band of red, green, or yellow visible light.

The LED may further include a transparent substrate on the optical filter layer.

The LED may further include a transparent layer between the optical wavelength conversion layer and the optical filter layer.

An upper surface of the second-conductivity-type semiconductor layer contacting the optical wavelength conversion layer may have uneven patterns.

The optical filter layer may have a structure in which a first dielectric film with a first refractive index and a first thickness and a second dielectric film with a second refractive index and a second thickness are alternately stacked.

The first and second refractive indexes and the first and second thicknesses may be designed such that each of a product of the first refractive index and the first thickness and a product of the second refractive index and the second thickness is substantially equal to ¼ of the first peak wavelength.

The optical filter layer may include a distributed Bragg reflector (DBR) configured to reflect light having the first peak wavelength.

The LED may further include a reflection layer disposed at a side of the optical wavelength conversion layer and configured to reflect light emitted from the optical wavelength conversion layer in a lateral direction.

The LED may further include: a first electrode electrically connected to the first-conductivity-type semiconductor layer; and a second electrode electrically connected to the second-conductivity-type semiconductor layer.

The first and second electrodes may be disposed under the first-conductivity-type semiconductor layer, and the second electrode may be electrically connected to the second-conductivity-type semiconductor layer via a conductive via passing through the first-conductivity-type semiconductor layer and the active layer.

The first electrode may be disposed on a portion of the first-conductivity-type semiconductor layer, the active layer may be disposed on another portion of the first-conductivity-type semiconductor layer, and the second electrode may be disposed between the second-conductivity-type semiconductor layer and the optical wavelength conversion layer.

The LED may further include a reflection layer disposed at a side of the active layer and configured to reflect light emitted from the active layer in a lateral direction.

The first electrode may be disposed under the first-conductivity-type semiconductor layer and include an extension portion extending in a lateral direction and exposed to the outside, and the second electrode may be disposed under the first electrode and be electrically connected to the second-conductivity-type semiconductor layer via a conductive via passing through the first electrode, the first-conductivity-type semiconductor layer, and the active layer.

According to another aspect of the inventive concept, there is provided a three-color light-emitting apparatus including: first to third light-emitting structures each including a first-conductivity-type semiconductor layer, an active layer, and a second-conductivity-type semiconductor layer and configured to emit first light having a first peak wavelength; a first optical wavelength conversion layer disposed on the first light-emitting structure and configured to absorb the first light emitted from the first light-emitting structure and emit second light having a second peak wavelength different from the first peak wavelength; a second optical wavelength conversion layer disposed on the second light-emitting structure and configured to absorb the first light emitted from the second light-emitting structure and emit third light having a third peak wavelength different from the first and second peak wavelengths; and first and second optical filter layers respectively disposed on the first and second optical wavelength conversion layers and configured to reflect the first light emitted from the first and second light-emitting structures.

The first peak wavelength may be included in a wavelength band of blue visible light, the second peak wavelength may be included in a wavelength band of red visible light, and the third peak wavelength may be included in a wavelength band of green or yellow visible light.

Each of the first and second optical filter layers may have a structure in which a first dielectric film with a first refractive index and a second dielectric film with a second refractive index are alternately stacked.

A planar area of the third light-emitting structure among the first to third light-emitting structures may be smallest.

According to another aspect of the inventive concept, there is provided a display device including: a plurality of pixels each including at least a first subpixel with a first LED, and a second subpixel with a second LED, wherein the first LED includes: a first light-emitting structure including a first-conductivity-type semiconductor layer, an active layer, and a second-conductivity-type semiconductor layer and configured to emit first light having a first peak wavelength; a first optical wavelength conversion layer disposed on the first light-emitting structure and configured to absorb the first light emitted from the first light-emitting structure and emit second light having a second peak wavelength different from the first peak wavelength; and a first optical filter layer disposed on the first optical wavelength conversion layer and configured to reflect the first light emitted from the first light-emitting structure and transmit the second light emitted from the first optical wavelength conversion layer.

The second LED may include: a second light-emitting structure including the first-conductivity-type semiconductor layer, the active layer, and the second-conductivity-type semiconductor layer and configured to emit the first light having the first peak wavelength; a second optical wavelength conversion layer disposed on the second light-emitting structure and configured to absorb the first light emitted from the second light-emitting structure and emit third light having a third peak wavelength different from the first and second peak wavelengths; and a second optical filter layer disposed on the second optical wavelength conversion layer and configured to reflect the first light emitted from the second light-emitting structure and transmit the third light emitted from the second optical wavelength conversion layer.

Each of the pixels may further include a third subpixel having a third light-emitting structure including the first-conductivity-type semiconductor layer, the active layer, and the second-conductivity-type semiconductor layer and configured to emit the first light having the first peak wavelength.

The first LED may emit red light, the second LED emits green light, and the third LED emits blue light.

A planar area of the third subpixel among the first to third subpixels may be smallest.

BRIEF DESCRIPTION OF THE DRAWINGS

Exemplary embodiments of the inventive concept will be more clearly understood from the following detailed description taken in conjunction with the accompanying drawings in which:

FIGS. 13A to 13K are cross-sectional views for describing a method of manufacturing the LED package of FIG. 12, according to an exemplary embodiment of the inventive concept;

DETAILED DESCRIPTION OF THE EMBODIMENTS

Figure 1:
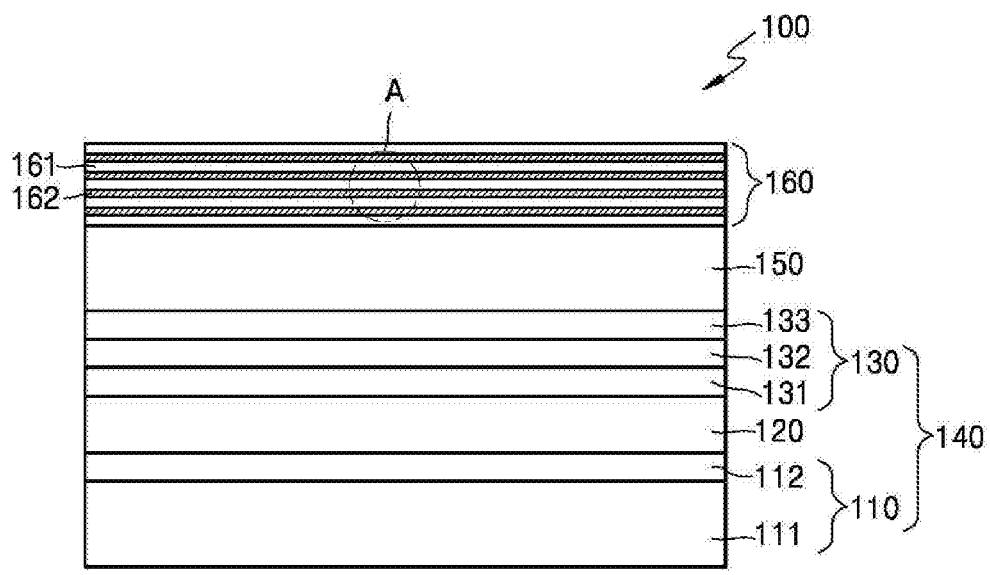
FIG. 1 is a cross-sectional view of a part of a light-emitting diode (LED) package according to an exemplary embodiment of the inventive concept.
Figure 1:
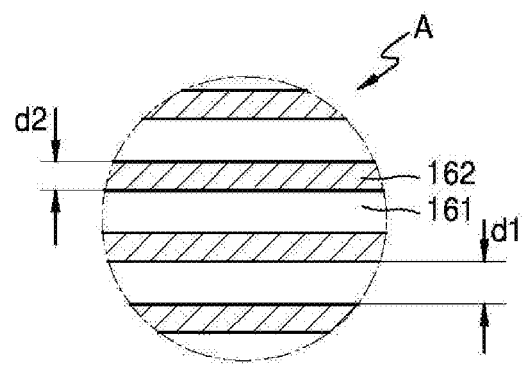

Hereinafter, exemplary embodiments of the inventive concept will be described with reference to the accompanying drawings. The inventive concept may, however, be embodied in many different forms and should not be construed as being limited to the exemplary embodiments set forth herein; rather, these exemplary embodiments are provided so that this disclosure will be thorough and complete, and will fully convey the inventive concept to those of ordinary skill in the art. It should be understood, however, that there is no intent to limit the inventive concept to the particular forms disclosed, but on the contrary, the inventive concept is to cover all modifications, equivalents, and alternatives falling within the spirit and scope of the inventive concept. In the drawings, the dimensions of structures are exaggerated for clarity of the inventive concept.

Hereinafter, exemplary embodiments of the inventive concept will be described with reference to the accompanying drawings. In the accompanying drawings, the modifications of the illustrated shapes may be expected according to manufacturing technologies and/or tolerance. Therefore, the exemplary embodiments should not be construed as being limited to specific shapes of the illustrated regions. The shapes may be changed during the manufacturing processes. The following exemplary embodiments may be combined.

FIG. 1 is a cross-sectional view of a part of a light-emitting diode (LED) 100 according to an exemplary embodiment of the inventive concept.

Referring to FIG. 1, the LED 100 may include a light-emitting structure 140, an optical wavelength conversion layer 150, and an optical filter layer 160.

The light-emitting structure 140 may include a first-conductivity-type semiconductor layer 110, an active layer 120, and a second-conductivity-type semiconductor layer 130, which are sequentially stacked.

The first-conductivity-type semiconductor layer 110 may be an n-type nitride semiconductor having a composition of $In_xAl_yGa_{1-x-y}N$ ($0 \le x < 1$, $0 \le y < 1$, $0 \le x+y < 1$), and an n-type impurity may be silicon (Si). For example, the first-conductivity-type semiconductor layer 110 may include n-type GaN.

According to an exemplary embodiment, the first-conductivity-type semiconductor layer 110 may include a first-conductivity-type semiconductor contact layer 111 and a current diffusion layer 112.

An impurity concentration of the first-conductivity-type semiconductor contact layer 111 may be in the range of about $2 \times 10^{18}$ $cm^{-3}$ to about $9 \times 10^{19}$ $cm^{-3}$. The first-conductivity-type semiconductor contact layer 111 may have a thickness of about 1 μm to about 5 μm.

The current diffusion layer 112 may have a structure in which a plurality of $InAl_yGa_{(1-x-y)}N$ layers ($0 \le x$, $y \le 1$, $0 \le x+y \le 1$) having different compositions or different impurity content are repeatedly stacked. For example, the current diffusion layer 112 may have a thickness of about 1 nm to about 500 nm and may be an n-type superlattice layer in which two or more different layers having a composition of $Al_xIn_yGa_zN$ ($0 \le x,y,z \le 1$, except for $x=y=z=0$) like an n-type GaN layer are repeatedly stacked. An impurity concentration of the current diffusion layer 112 may be in the range of about $2 \times 10^{18}$ $cm^{-3}$ to about $9 \times 10^{19}$ $cm^{-3}$. If necessary, the current diffusion layer 112 may further include an insulating material layer.

The second-conductivity-type semiconductor layer 130 may be a nitride semiconductor satisfying p-type $In_xAl_yGa_{1-x-y}N$ ($0 \le x < 1$, $0 \le y < 1$, $0 \le x+y < 1$), and a p-type impurity may be magnesium (Mg). The second-conductivity-type semiconductor layer 130 may have a single-layer structure, but may also have a multilayer structure with different compositions. The second-conductivity-type semiconductor layer 130 may include an electron blocking layer (EBL) 131, a low-concentration p-type GaN layer 132, and a high-concentration p-type GaN layer 133 serving as a contact layer.

For example, the electron blocking layer 131 may have a thickness of about 5 nm to about 100 nm and may have a structure in which $In_xAl_yGa_{(1-x-y)}N$ layers having different compositions are stacked, or may be a single layer including $Al_yGa_{(1-y)}N$. An energy band gap (Eg) of the electron blocking layer 131 may decrease as the distance from the active layer 120 increases. For example, aluminium (Al) content of the electron blocking layer 131 may decrease as the distance from the active layer 120 increases.

The active layer 120 may have a multi quantum well (MQW) structure in which a quantum well layer and a quantum barrier layer are alternately stacked. For example, the quantum well layer and the quantum barrier layer may include $In_xAl_yGa_{1-x-y}N$ ($0 \le x \le 1$, $0 \le y \le 1$, $0 \le x+y \le 1$) having different compositions. According to an exemplary embodiment, the quantum well layer may include $In_xGa_{1-x}N$ ($0 < x \le 1$) and the quantum barrier layer may include GaN or AlGaN. Each of the quantum well layer and the quantum barrier layer may have a thickness of about 1 nm to about 50 nm. The active layer 120 is not limited to the MQW structure and may have a single quantum well (SQW) structure.

The LED 100 may further include a first electrode (not illustrated) electrically connected to the first-conductivity-type semiconductor layer 110, and a second electrode (not illustrated) electrically connected to the second-conductivity-type semiconductor layer 130. The light-emitting structure 140, to which the first and second electrodes are connected, may be referred to as an LED or a semiconductor LED. The first and second electrodes may be disposed at various positions and have various shapes, depending on the configuration of the LED.

The light-emitting structure 140 may emit first light having a first peak wavelength. The first peak wavelength may be included in a wavelength band of a first color of visible light or may be included in a wavelength band of ultraviolet light. As one example, the first color may be a blue color. As another example, the first color may be a red color, a green color, or a yellow color.

The optical wavelength conversion layer 150 may be disposed on the light-emitting structure 140. The optical wavelength conversion layer 150 may be disposed between the light-emitting structure 140 and the optical filter layer 160.

The optical wavelength conversion layer 150 may absorb the first light having the first peak wavelength, which is emitted from the light-emitting structure 140, and emit second light having a second peak wavelength. The second peak wavelength may be different from the first peak wavelength and the first color may be different from the second color. The second peak wavelength may be included in a wavelength band of the second color of visible light. The second color may be one of a red color, a green color, and a yellow color. According to another exemplary embodiment, when the color of the first light emitted from the light-emitting structure 140 is one of a red color, a green color, and a yellow color, the second color of the light emitted from the optical wavelength conversion layer 150 may be a blue color.

Various materials, such as phosphors and/or quantum dots, may be used as a wavelength conversion material for converting the wavelength of the first light emitted from the light-emitting structure 140.

The phosphors used for the optical wavelength conversion layer 150 may have the following empirical formulas and colors.

Oxide-based: yellow color and green color $Y_3Al_5O_{12}$:Ce, $Tb_3Al_5O_{12}$:Ce, $Lu_3Al_5O_{12}$:Ce Silicate-based: yellow color and green color $(Ba,Sr)_2SiO_4$:Eu, yellow color and orange color $(Ba,Sr)_3SiO_5$:Ce Nitride-based: green color β-SiAlON:Eu, yellow color $La_3Si_6O_{11}$:Ce, orange color α-SiAlON:Eu, red color $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \le x \le 3$, $0 < z < 0.3$, $0 < y \le 4$)

Herein, Ln may be at least one of group IIIa elements or rare-earth elements, and M may be at least one of calcium (Ca), barium (Ba), strontium (Sr), or magnesium (Mg).

Fluoride-based: KSF-based red color $K_2SiF_6:Mn_4^+$, $K_2TiF_6:Mn_4^+$, $NaYF_4:Mn_4^+$, $NaGdF_4:Mn_4^+$, $K_3SiF_7:Mn_4^+$ The composition of the phosphor basically needs to conform with stoichiometry, and the respective elements may be substituted by other elements included in the respective groups of the periodic table. For example, strontium (Sr) may be substituted by at least one of barium (Ba), calcium (Ca), or magnesium (Mg) of alkaline-earth group II, and Y may be substituted by at least one of terbium (Tb), lutetium (Lu), scandium (Sc), and gadolinium (Gd). In addition, europium (Eu), which is an activator, may be substituted by at least one of cerium (Ce), terbium (Tb), praseodymium (Pr), erbium (Er), or ytterbium (Yb) according to a desired energy level. The activator may be applied solely or a sub-activator may be additionally applied to modify the characteristics of the phosphor.

In particular, in order to improve the reliability at high-temperature and high-humidity conditions, the fluoride-based red phosphor may be coated with an Mn-free fluoride material or may further include an organic coating on the surface of the phosphor or the coated surface of the Mn-free fluoride material. In the case of the fluoride-based red phosphor, a narrow full width at half maximum (FWHM) of about 40 nm or less unlike other phosphors can be implemented. Thus, the fluoride-based red phosphor may be applied to a high-resolution TV such as an ultra-high-definition (UHD) TV.

Table 1 below shows phosphors usable as the wavelength conversion materials according to applications when the peak wavelength of the light emitted from the light-emitting structure 140 is within a wavelength band of blue visible light (about 440 nm to about 460) or a wavelength ban of ultraviolet light (about 380 nm to about 440 nm).

TABLE 1

| Usage | Phosphor |
| --- | --- |
| LED TV BLU | β-SiAlON:Eu2+ |
| | (Ca,Sr)AlSiN3:Eu2+ |
| | $La_3Si_6N_{11}$:Ce3+ |
| | $K_2SiF_6$:Mn4+ |
| | SrLiAl3N4:Eu |
| | $Ln_{4-x}(Eu_zM_{1-z})_xSi_{12-y}Al_yO_{3+x+y}N_{18-x-y}$ |
| | ($0.5 \leq x \leq 3, 0 < z < 0.3, 0 < y \leq 4$) |
| | K2TiF6:Mn4+ |
| | NaYF4:Mn4+ |
| | NaGdF4:Mn4+ |
| Illumination | $Lu_3Al_5O_{12}$:Ce3+ |
| | Ca-α-SiAlON:Eu2+ |
| | $La_3Si_6N_{11}$:Ce3+ |
| | (Ca,Sr)AlSiN3:Eu2+ |
| | $Y_3Al_5O_{12}$:Ce3+ |
| | $K_2SiF_6$:Mn4+ |
| | SrLiAl3N4:Eu |
| | $Ln_{4-x}(Eu_zM_{1-z})_xSi_{12-y}Al_yO_{3+x+y}N_{18-x-y}$ |
| | ($0.5 \leq x \leq 3, 0 < z < 0.3, 0 < y \leq 4$) |
| | K2TiF6:Mn4+ |
| | NaYF4:Mn4+ |
| | NaGdF4:Mn4+ |
| Side View (Mobile, Note PC) | $Lu_3Al_5O_{12}$:Ce3+ |
| | Ca-α-SiAlON:Eu2+ |
| | $La_3Si_6N_{11}$:Ce3+ |
| | (Ca,Sr)AlSiN3:Eu2+ |
| | $Y_3Al_5O_{12}$:Ce3+ |
| | (Sr,Ba,Ca,Mg)2SiO4:Eu2+ |
| | $K_2SiF_6$:Mn4+ |
| | SrLiAl3N4:Eu |
| | $Ln_{4-x}(Eu_zM_{1-z})_xSi_{12-y}Al_yO_{3+x+y}N_{18-x-y}$ |
| | ($0.5 \leq x \leq 3, 0 < z < 0.3, 0 < y \leq 4$) |

TABLE 1-continued

| Usage | Phosphor |
| --- | --- |
| | K2TiF6:Mn4+ |
| | NaYF4:Mn4+ |
| | NaGdF4:Mn4+ |
| Electrical Component (Head Lamp, etc.) | $Lu_3Al_5O_{12}$:Ce3+ |
| | Ca-α-SiAlON:Eu2+ |
| | $La_3Si_6N_{11}$:Ce3+ |
| | (Ca,Sr)AlSiN3:Eu2+ |
| | $Y_3Al_5O_{12}$:Ce3+ |
| | $K_2SiF_6$:Mn4+ |
| | SrLiAl3N4:Eu |
| | $Ln_{4-x}(Eu_zM_{1-z})_xSi_{12-y}Al_yO_{3+x+y}N_{18-x-y}$ |
| | ($0.5 \leq x \leq 3, 0 < z < 0.3, 0 < y \leq 4$) |
| | K2TiF6:Mn4+ |
| | NaYF4:Mn4+ |
| | NaGdF4:Mn4+ |

The wavelength conversion layer 150 may include a quantum dot (QD) as the wavelength conversion material, instead of the phosphor or in combination with the phosphor.

Figure 15:
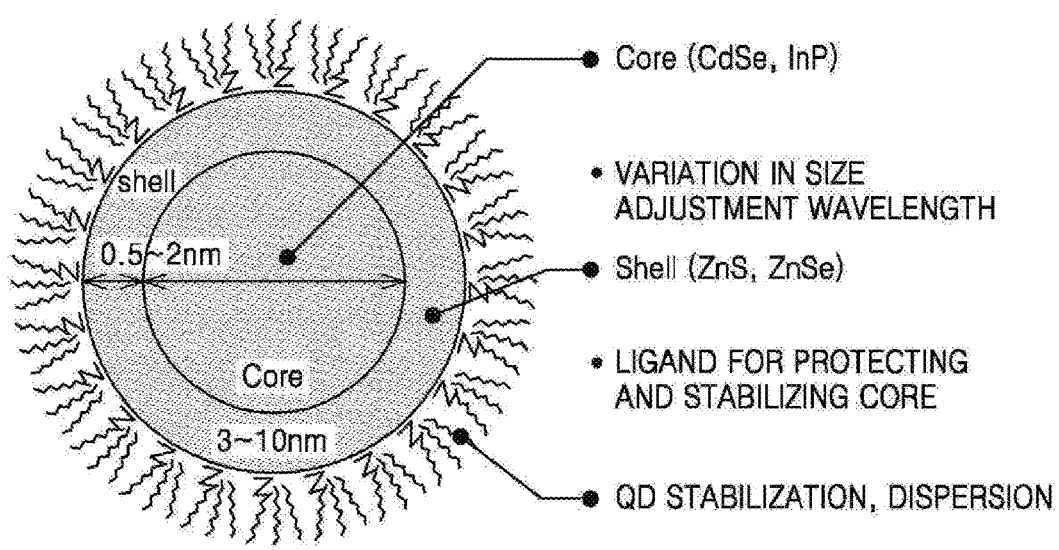
FIG. 15 is a cross-sectional view of a structure of a quantum dot.

FIG. 15 is a cross-sectional view of a structure of a QD. Referring to FIG. 15, the QD may have a core-shell structure using group III-V or II-VI compound semiconductors. For example, the QD may have a core such as CdSe or InP and a shell such as ZnS or ZnSe. The core may have a diameter of about 1 nm to about 30 nm, or about 3 nm to about 10 nm. The shell may have a thickness of about 0.1 nm to about 20 nm, or about 0.5 nm to about 2 nm. In addition, the QD may include a ligand for stabilizing the core and the shell.

The QD may implement various colors depending on its size. In particular, when the QD is used as a phosphor substitute, the QD may be used as a wavelength conversion material to emit red light or green light. If the QD is used as the wavelength conversion material, a narrow FWHM of about 35 nm may be achieved.

Referring to FIG. 1 again, the optical filter layer 160 may be disposed on the optical wavelength conversion layer 150. The optical filter layer 160 may reflect the first light having the first peak wavelength emitted from the light-emitting structure 140, and transmit the second light having the second peak wavelength emitted from the optical wavelength conversion layer 150. Portion A of FIG. 1 illustrates an enlarged cross-section of the optical filter layer 160.

The optical filter layer 160 may have a multilayer reflection structure in which a plurality of dielectric films having different refractive indexes are alternately stacked. For example, the optical filter layer 160 may have a multilayer reflection structure in which a first dielectric film 161 having a first refractive index n1 and a first thickness d1 and a second dielectric film 162 having a second refractive index n2 and a second thickness d2 are alternately and repeatedly stacked. According to an exemplary embodiment, the optical filter layer 160 may be a distributed Bragg reflector (DBR) configured to reflect the first light having the first peak wavelength emitted from the light-emitting structure 140.

The multilayer reflection structure may have a structure in which a plurality of dielectric films (e.g., 161 and 162) having different refractive indexes are alternately stacked twice to hundred times. For example, in order to form the optical filter layer 160 having the multilayer reflection structure, the first and second dielectric films 161 and 162 may be alternately stacked three times to seventy times, or four times to fifty times.

Each of the first and second dielectric films 161 and 162 in the multilayer reflection structure may include oxide or nitride (e.g., $SiO_2$, SiN, $SiO_xN_y$, $TiO_2$, $Nb_2O_5$, $Si_3N_4$, $Al_2O_3$, TiN, AlN, $ZrO_2$, TiAlN, TiSiN, etc.), or any mixtures thereof. For example, the first dielectric film 161 may include silicon oxide ($SiO_2$), and the second dielectric film 162 may include titanium oxide ($TiO_2$) or niobium oxide ($Nb_2O_5$).

A refractive index of each of the first and second dielectric films 161 and 162 may be in the range of about 1.4 to about 3.0. A dielectric film contacting the optical wavelength conversion layer 150 may be selected as a dielectric film having a difference within 1.6 in a refractive index from the optical wavelength conversion layer 150 among the first and second dielectric films 161 and 162. In addition, a dielectric film disposed in the uppermost portion of the optical filter layer 160 may be selected as a dielectric film having a low refractive index among the first and second dielectric films 161 and 162.

When the first peak wavelength of the first light generated by the active layer 120 of the light-emitting structure 140 is $\lambda 1$ and the refractive indexes of the first and second dielectric films 161 and 162 are n1 and n2, respectively, the thicknesses of the first and second dielectric films 161 and 162 are $\lambda 1/4n1$ and $\lambda 2/4n2$, respectively. That is, the product (n1×d1) of the first refractive index n1 and the first thickness d1 of the first dielectric film 161 may be equal to ¼ of the first peak wavelength ($\lambda 1$), i.e., ($\lambda 1$)/4. The product (n2×d2) of the second refractive index n2 and the second thickness d2 of the second dielectric film 162 may be equal to ¼ of the first peak wavelength ($\lambda 1$), i.e., ($\lambda 1$)/4. The thicknesses d1 and d2 of the first and second dielectric films 161 and 162 may be in the range of about 300□ to about 900□. The first refractive index n1 and the first thickness d1 of the first dielectric film 161 and the second refractive index n2 and the second thickness d2 of the second dielectric film 162 may be appropriately selected and the number of stacks of the first and second dielectric films 161 and 162 may be selected, so that the multilayer reflection structure of the optical filter layer 160 has a high reflectivity of about 95% or more with respect to the first peak wavelength ($\lambda 1$) of the first light generated by the active layer 120.

The optical filter layer 160 may selectively reflect only the first light having the first peak wavelength, emitted from the light-emitting structure 140, and transmit light having the other wavelengths. For example, the optical filter layer 160 may transmit the second light having the second peak wavelength emitted from the optical wavelength conversion layer 150. Therefore, the optical filter layer 160 may function as a band-stop optical filter that reflects only the first light having the first peak wavelength. According to another exemplary embodiment, the optical filter layer 160 may function as a band-pass optical filter that transmits only the second light having the second peak wavelength. According to another exemplary embodiment, when the first peak wavelength is shorter than the second peak wavelength, the optical filter layer 160 may function as a low-pass optical filter that blocks the first light having the first peak wavelength and transmits the second light having the second peak wavelength.

Although not illustrated in FIG. 1, a reflection layer, from which the first light generated by the active layer 120 is reflected, may be disposed under the first-conductivity-type semiconductor layer 110.

Figure 2:
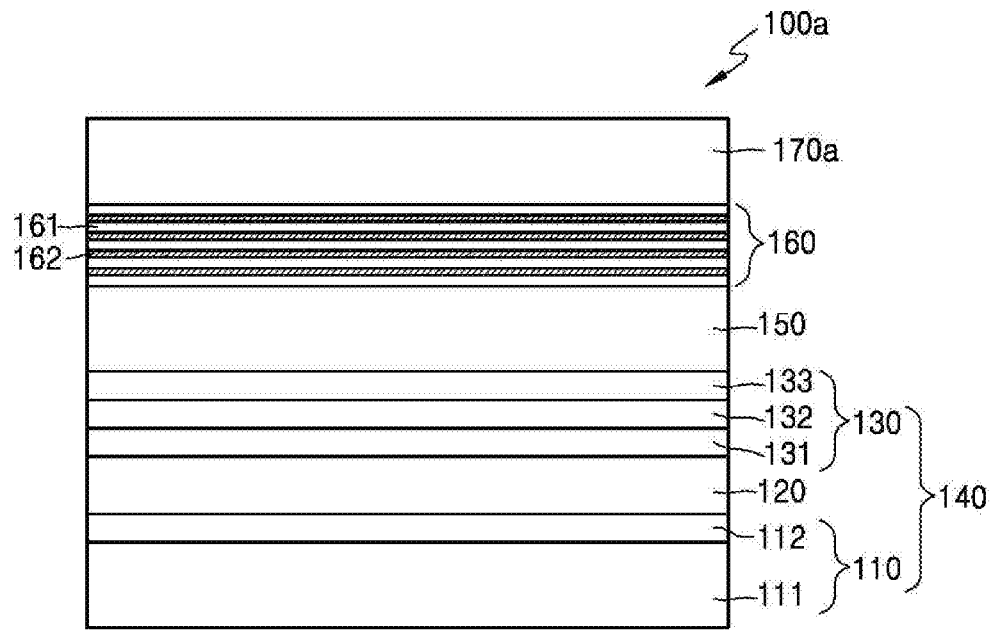
FIG. 2 is a cross-sectional view of a part of an LED according to another exemplary embodiment of the inventive concept.

FIG. 2 is a cross-sectional view of a part of an LED 100a according to another exemplary embodiment of the inventive concept.

Referring to FIG. 2, the LED 100a may include a light-emitting structure 140, an optical wavelength conversion layer 150, an optical filter layer 160, and a transparent substrate 170a. The light-emitting structure 140 may include a first-conductivity-type semiconductor layer 110, an active layer 120, and a second-conductivity-type semiconductor layer 130, which are sequentially stacked. The light-emitting structure 140, the optical wavelength conversion layer 150, and the optical filter layer 160 of the LED 100a illustrated in FIG. 2 respectively correspond to the light-emitting structure 140, the optical wavelength conversion layer 150, and the optical filter layer 160 of the LED 100 illustrated in FIG. 1, and redundant descriptions thereof will be omitted for the sake of simplicity.

The transparent substrate 170a may be so transparent as to transmit second light having a second peak wavelength which is generated from the optical wavelength conversion layer 150 and passes through the optical filter layer 160. The transparent substrate 170a may include glass, silicon, or polymer.

A refractive index of the transparent substrate 170a may be lower than refractive indexes of first and second dielectric films 161 and 162 of the optical filter layer 160. A dielectric film disposed in the uppermost portion of the optical filter layer 160 may be selected as a dielectric film having a difference within 1.6 in a refractive index from the transparent substrate 170a among the first and second dielectric films 161 and 162.

The optical filter layer 160 may be disposed on the transparent substrate 170a. The transparent substrate 170a may support the optical filter layer 160. The optical filter layer 160 disposed on the transparent substrate 170a may be fixed on the optical wavelength conversion layer 150. Before the optical wavelength conversion layer 150 is completely cured, the transparent substrate 170a on which the optical filter layer 160 is formed is turned over and the optical wavelength conversion layer 150 is pressed against the optical filter layer 160. Then, the optical wavelength conversion layer 150 is cured. In this manner, the optical filter layer 160 may be bonded to the optical wavelength conversion layer 150. The optical filter layer 160 may be bonded to the optical wavelength conversion layer 150 by using an adhesive.

Figure 3:
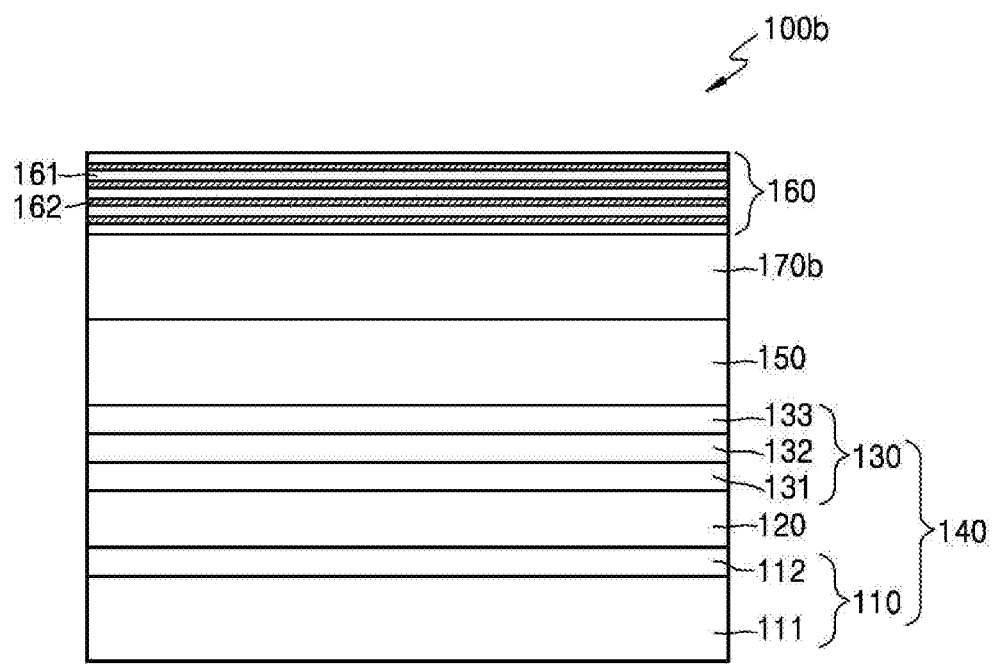
FIG. 3 is a cross-sectional view of a part of an LED according to another exemplary embodiment of the inventive concept.

FIG. 3 is a cross-sectional view of a part of an LED 100b according to another exemplary embodiment of the inventive concept.

Referring to FIG. 3, the LED 100b may include a light-emitting structure 140, an optical wavelength conversion layer 150, a transparent layer 170b, and an optical filter layer 160. The light-emitting structure 140 may include a first-conductivity-type semiconductor layer 110, an active layer 120, and a second-conductivity-type semiconductor layer 130, which are sequentially stacked. The light-emitting structure 140, the optical wavelength conversion layer 150, and the optical filter layer 160 of the LED 100b illustrated in FIG. 3 respectively correspond to the light-emitting structure 140, the optical wavelength conversion layer 150, and the optical filter layer 160 of the LED 100 illustrated in FIG. 1, and redundant descriptions thereof will be omitted.

The transparent layer 170b may be transparent so that second light having a second peak wavelength, which is generated from the optical wavelength conversion layer 150, travels toward the optical filter layer 160. The transparent layer 170b may include glass, silicon, or polymer. The transparent layer 170b may be substantially the same as the transparent substrate 170a illustrated in FIG. 2, except for the positions of the transparent layer 170b and the transparent substrate 170a.

The transparent substrate 170a may be made of a material having a refractive index in a range between a refractive index of the optical wavelength conversion layer 150 and a refractive index of the first or second dielectric film 161 or 162. A dielectric film contacting the transparent layer 170b may be selected as a dielectric film having a small difference in a refractive index from the transparent layer 170b among the first and second dielectric films 161 and 162.

The optical filter layer 160 may be disposed on the transparent layer 170b such as a transparent substrate. The transparent layer 170b disposed on the optical filter layer 160 may be fixed on the optical wavelength conversion layer 150. Before the optical wavelength conversion layer 150 is completely cured, the transparent layer 170b on which the optical filter layer 160 is formed is pressed against the optical filter layer 160, and the optical wavelength conversion layer 150 is cured. In this manner, the transparent layer 170b may be bonded on the optical wavelength conversion layer 150. The transparent layer 170b on which the optical filter layer 160 is formed may be bonded to the optical wavelength conversion layer 150 by using an adhesive.

Figure 4:
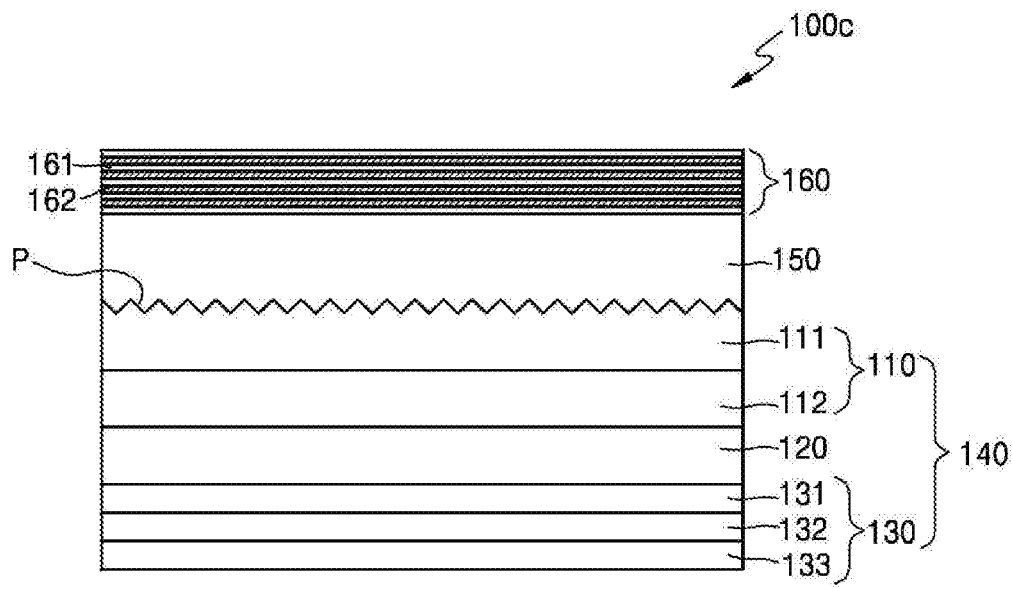
FIG. 4 is a cross-sectional view of a part of an LED according to another exemplary embodiment of the inventive concept.

FIG. 4 is a cross-sectional view of a part of an LED 100c according to another exemplary embodiment of the inventive concept.

Referring to FIG. 4, the LED 100c may include a light-emitting structure 140, an optical wavelength conversion layer 150, and an optical filter layer 160. The light-emitting structure 140 may include a first-conductivity-type semiconductor layer 110, an active layer 120, and a second-conductivity-type semiconductor layer 130, which are sequentially stacked. The LED 100c may be substantially identical to the LED 100 illustrated in FIG. 1, except that uneven patterns P are formed on the upper surface of the light-emitting structure 140 such that the interface between the light-emitting structure and the optical wavelength conversion layer 150 is non-planar. The light-emitting structure 140, the optical wavelength conversion layer 150, and the optical filter layer 160 of the LED 100c illustrated in FIG. 4 respectively correspond to the light-emitting structure 140, the optical wavelength conversion layer 150, and the optical filter layer 160 of the LED 100 illustrated in FIG. 1, and redundant descriptions thereof will be omitted. The stacking order of the first-conductivity-type semiconductor layer 110, the active layer 120, and the second-conductivity-type semiconductor layer 130 in FIG. 4 is different from the stacking order of the first-conductivity-type semiconductor layer 110, the active layer 120, and the second-conductivity-type semiconductor layer 130 in FIG. 1. Specifically, the first-conductivity-type semiconductor layer 110 may be disposed on the active layer 120, and the active layer 120 may be disposed on the second-conductivity-type semiconductor layer 130.

As illustrated in FIG. 4, the uneven patterns P may be formed on the upper surface of the light-emitting structure 140, that is, the upper surface of the first-conductivity-type semiconductor layer 110. The uneven patterns P may increase the light extraction efficiency of the LED 100c.

The uneven patterns P may be formed on the upper surface of the first-conductivity-type semiconductor layer 110 by sequentially forming the first-conductivity-type semiconductor layer 110, the active layer 120, and the second-conductivity-type semiconductor layer 130 on a substrate having an uneven surface, turning over the substrate, and removing the substrate. The uneven patterns P may improve the single crystal quality of the second-conductivity-type semiconductor layer 130.

Figure 5:
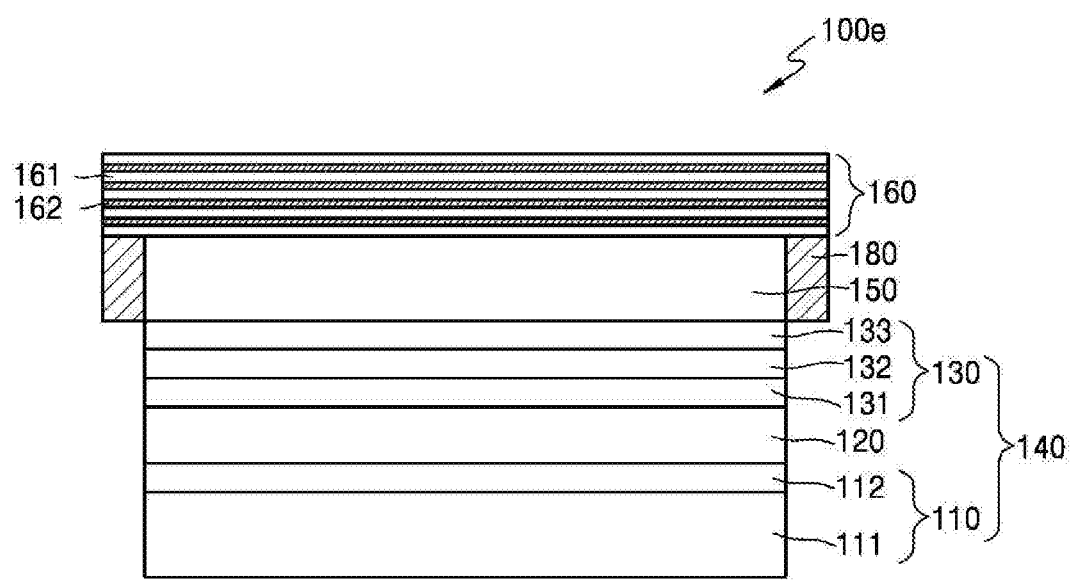
FIG. 5 is a cross-sectional view of a part of an LED according to another exemplary embodiment of the inventive concept.

FIG. 5 is a cross-sectional view of a part of an LED 100d according to another exemplary embodiment of the inventive concept.

Referring to FIG. 5, the LED 100d may include a light-emitting structure 140, an optical wavelength conversion layer 150, a reflection layer 180, and an optical filter layer 160. The light-emitting structure 140 may include a first-conductivity-type semiconductor layer 110, an active layer 120, and a second-conductivity-type semiconductor layer 130, which are sequentially stacked.

The LED 100d may be substantially identical to the LED 100 illustrated in FIG. 1, except that the reflection layer 180 is further included. The light-emitting structure 140, the optical wavelength conversion layer 150, and the optical filter layer 160 of the LED 100d illustrated in FIG. 5 respectively correspond to the light-emitting structure 140, the optical wavelength conversion layer 150, and the optical filter layer 160 of the LED 100 illustrated in FIG. 1, and redundant descriptions thereof will be omitted.

The reflection layer 180 may be disposed at a side, for example, a lateral side, of the optical wavelength conversion layer 150 and prevent lateral emission of first light that is not completely absorbed in the optical wavelength conversion layer 150. The reflection layer 180 may reflect the first light, which is generated from the light-emitting structure 140 and is emitted in a lateral direction through the optical wavelength conversion layer 150, toward the inside of the optical wavelength conversion layer 150. The reflection layer 180 may include a reflective material, such as $TiO_2$ or $Al_2O_3$. According to another exemplary embodiment, the reflection layer 180 may have a multilayer reflection structure in which a plurality of dielectric films having different refractive indexes are alternately stacked. According to another exemplary embodiment, the reflection layer 180 may have a light reflection structure formed by dispersing a light reflective filler in a light transmissive material. Although not illustrated in FIG. 5, the reflection layer 180 may extend downward to cover the side of the light-emitting structure 140. The reflection layer 180, which extends to the side of the light-emitting structure 140, may prevent external emission of the first light emitted from the active layer 120. According to another exemplary embodiment, an additional reflection layer may be disposed at the side of the light-emitting structure 140, for example, at the side of the active layer 120. Since the reflection layer 180 is disposed at the sides of the light-emitting structure 140 and the optical wavelength conversion layer 150, the first light generated by the light-emitting structure 140 is not emitted to the outside of the LED 100d, and only the second light having the second peak wavelength, which is generated by the optical wavelength conversion layer 150, is emitted to the outside of the LED 100d. Therefore, the LED 100d may emit only a high-purity light of a second color.

Figure 6:
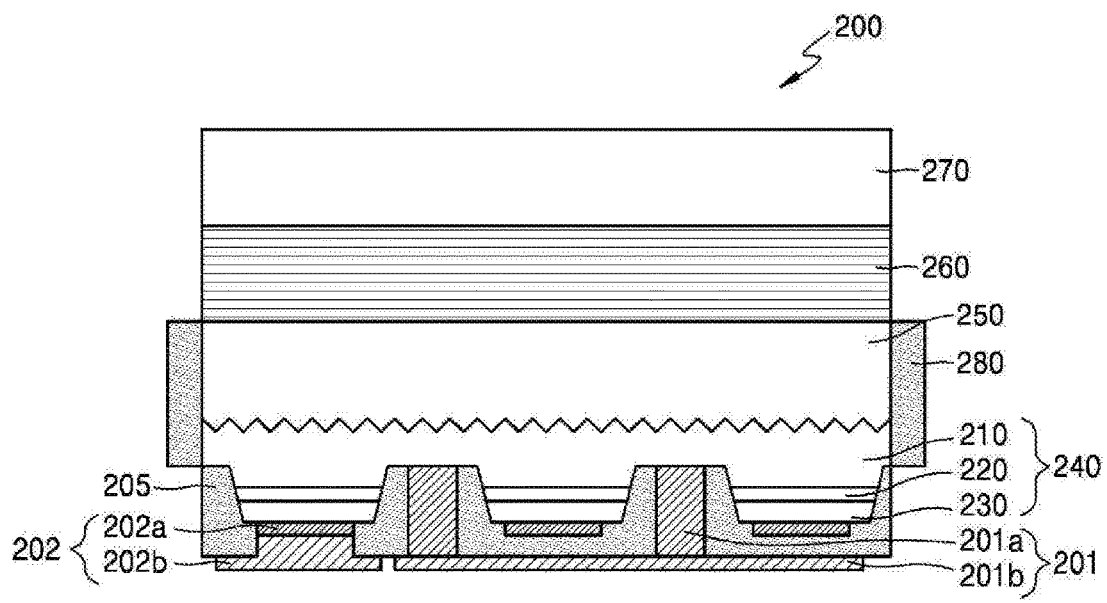
FIG. 6 is a cross-sectional view of a part of an LED according to another exemplary embodiment of the inventive concept.

FIG. 6 is a cross-sectional view of a part of an LED 200 according to another exemplary embodiment of the inventive concept.

Referring to FIG. 6, the LED 200 may include a light-emitting structure 240, an optical wavelength conversion layer 250, and an optical filter layer 260. The light-emitting structure 240 may include a first-conductivity-type semiconductor layer 210, an active layer 220, and a second-conductivity-type semiconductor layer 230, which are sequentially stacked. The light-emitting structure 240, the optical wavelength conversion layer 250, and the optical filter layer 260 of the LED 200 illustrated in FIG. 6 respectively correspond to the light-emitting structure 140, the optical wavelength conversion layer 150, and the optical filter layer 160 of the LED 100 illustrated in FIG. 1, and redundant descriptions thereof will not be repeated. The stacking order of the light-emitting structure 240 illustrated in FIG. 6 is substantially identical to the stacking order of the light-emitting structure 140 illustrated in FIG. 4. That is, the first-conductivity-type semiconductor layer 210 may be disposed on the active layer 220, and the active layer 220 may be disposed on the second-conductivity-type semiconductor layer 230. In addition, similar to the LED 100c of FIG. 4, the first-conductivity-type semiconductor layer 210 may have an uneven upper surface so as to improve the light extraction efficiency of the LED 200 and the single crystal quality of the light-emitting structure 240.

The LED 200 may further include a transparent substrate 270 on the optical filter layer 260, and a reflection layer 280 that covers a side of the optical wavelength conversion layer 250. As illustrated in FIG. 6, the reflection layer 280 may cover a side of at least a portion of the first-conductivity-type semiconductor layer 210. The transparent substrate 270 and the reflection layer 280 respectively correspond to the transparent substrate 170a of the LED 100b illustrated in FIG. 2 and the reflection layer 180 of the LED 100d illustrated in FIG. 5, and redundant descriptions thereof will be omitted. According to another exemplary embodiment, the LED 200 may include a transparent layer between the optical wavelength conversion layer 250 and the optical filter layer 260, instead of the transparent substrate 270.

The LED 200 may further include a first electrode 201 and a second electrode 202. The first electrode 201 and the second electrode 202 may be electrically connected to the first-conductivity-type semiconductor layer 210 and the second-conductivity-type semiconductor layer 230, respectively.

The first electrode 201 may include one or more conductive vias 201a that pass through the second-conductivity-type semiconductor layer 230 and the active layer 220 and are connected to the first-conductivity-type semiconductor layer 210, and a first electrode pad 201b connected to the conductive via 201a. The conductive via 201a may be surrounded by an insulating layer 205 and be electrically isolated from the active layer 210 and the second-conductivity-type semiconductor layer 230. The conductive via 201a may be disposed within a contact hole formed by etching the light-emitting structure 240. In order to reduce the contact resistance between the conductive via 201a and the first-conductivity-type semiconductor layer 210, the number, shape, and pitch of the conductive vias 201a or the contact area therebetween may be appropriately selected. In addition, since the conductive via 201a is arranged to form a row and a column in the light-emitting structure 210, a current flow between the first electrode 201 and the second electrode 202 can be improved. The second electrode 202 may include an ohmic contact layer 202a and a second electrode pad 202b on the second-conductivity-type semiconductor layer 230.

The conductive via 201a and the ohmic contact layer 202b may have a single-layer or multilayer structure of a conductive material having ohmic characteristics with the first-conductivity-type semiconductor layer 210 and the second-conductivity-type semiconductor layer 230. For example, the conductive via 201a and the ohmic contact layer 202b may be formed by depositing or sputtering at least one of conductive materials, such as Ag, Al, Ni, Cr, or transparent conductive oxide (TCO).

The first and second electrode pads 201b and 202b may be respectively connected to the conductive via 201a and the ohmic contact layer 202b and function as external terminals of the light-emitting structure 240. For example, the first and second electrode pads 201b and 202b may include Au, Ag, Al, Ti, W, Cu, Sn, Ni, Pt, Cr, NiSn, TiW, AuSn, or eutectic metal thereof. The first and second electrodes 201 and 202 may be disposed in the same direction. For example, the first and second electrodes 201 and 202 may be mounted on a lead frame in a so-called flip-chip manner.

The first and second electrodes 201 and 202 may be electrically separated from each other by the insulating layer 205. Any suitable materials may be used for the insulating layer 205 as long as the materials have electrically insulating characteristics. Although any materials having electrically insulating characteristics may be used for the insulating layer 205, a material having a low light absorption rate can be used. For example, the insulating layer 205 may include silicon oxide or silicon nitride, such as $SiO_2$, $SiO_xN_y$, or $Si_xN_y$. According to another exemplary embodiment, the insulating layer 205 may have a light reflection structure formed by dispersing a light reflective filler in a light transmissive material. According to another exemplary embodiment, the insulating layer 205 may have a multilayer reflection structure in which a plurality of insulating films having different refractive indexes are alternately stacked. For example, the insulating layer 205 may be a DBR in which a first insulating film having a first refractive index and a second insulating film having a second refractive index are alternately stacked.

The multilayer reflection structure may be formed by repeatedly stacking a plurality of insulating films having different refractive indexes twice or more. For example, the plurality of insulating films having different refractive indexes may be repeatedly stacked twice to hundred times, three times to seventy times, or four times to fifty times. Each of the insulating films having the multilayer reflection structure may include oxide or nitride (e.g., $SiO_2$, SiN, $SiO_xN_y$, $TiO_2$, $Si_3N_4$, $Al_2O_3$, TiN, AlN, $ZrO_2$, TiAlN, TiSiN, etc.), or any mixtures thereof. For example, when the first peak wavelength of the first light generated by the active layer 220 is λ1 and the refractive indexes of the first and second insulating films are n1 and n2, respectively, the first and second insulating films may be formed to have a thickness of λ1/4n1 and λ1/4n2, respectively, For example, the insulating films included in the insulating layer 205 may have a thickness of about 300 Å and about 900 Å, respectively. The refractive indexes and thicknesses of the insulating films included in the insulating layer 205 may be appropriately selected, so that the insulating layer 205 has a high reflectivity of about 95% or more with respect to the first peak wavelength (λ1) of the first light generated by the active layer 220.

The first light generated by the active layer 220 may be reflected inward by the insulating layer 205, the reflection layer 280, and the optical filter layer 260 having reflection characteristics, and be incident on the optical wavelength conversion layer 250, thus increasing the optical wavelength conversion efficiency of the optical wavelength conversion layer 250. The first light having the first peak wavelength, which is generated by the active layer 220, may be converted into the second light having the second peak wavelength by the optical wavelength conversion layer 250, and the second light may be emitted to the outside through the optical filter layer 260. Therefore, the LED 200 may emit a high-purity color light.

Figure 7:
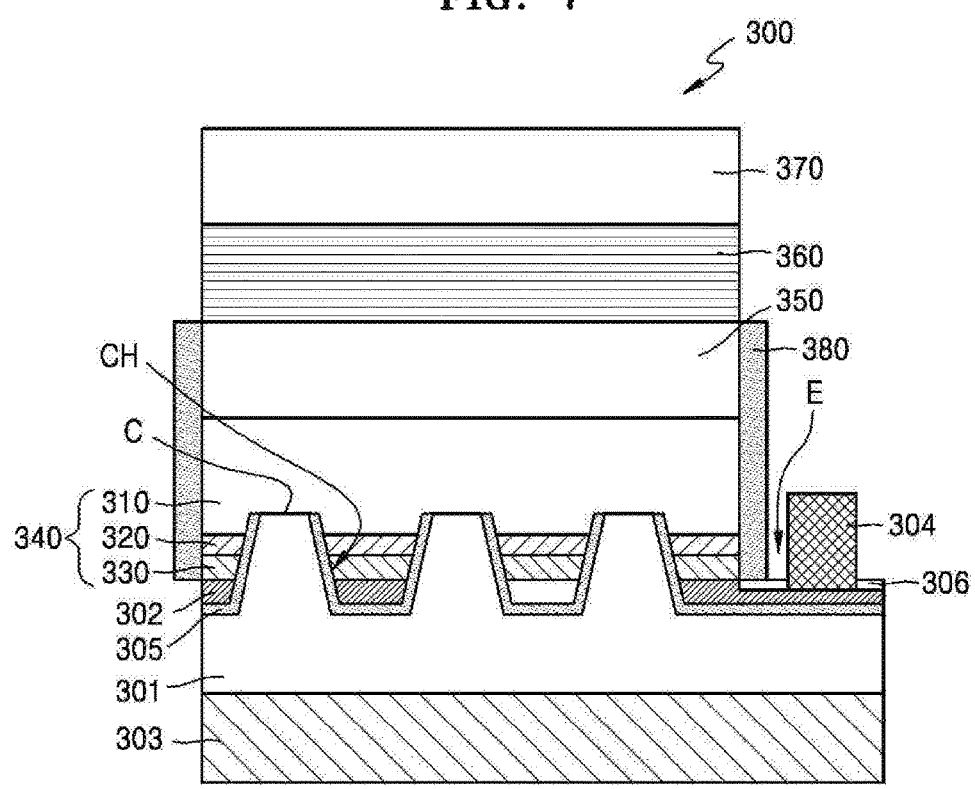
FIG. 7 is a cross-sectional view of a part of an LED according to another exemplary embodiment of the inventive concept.

FIG. 7 is a cross-sectional view of a part of an LED 300 according to another exemplary embodiment of the inventive concept.

Referring to FIG. 7, the LED 300 may include a light-emitting structure 340, an optical wavelength conversion layer 350, and an optical filter layer 360. The light-emitting structure 340 may include a second-conductivity-type semiconductor layer 330, an active layer 320, and a first-conductivity-type semiconductor layer 310, which are sequentially disposed on a conductive substrate 303. The light-emitting structure 340, the optical wavelength conversion layer 350, and the optical filter layer 360 of the LED 300 illustrated in FIG. 7 respectively correspond to the light-emitting structure 140, the optical wavelength conversion layer 150, and the optical filter layer 160 of the LED 100 illustrated in FIG. 1, and redundant descriptions thereof will be omitted. The stacking order of the light-emitting structure 340 illustrated in FIG. 7 is substantially identical to the stacking order of the light-emitting structure 140 illustrated in FIG. 4. That is, the first-conductivity-type semiconductor layer 310 may be disposed on the active layer 320, and the active layer 320 may be disposed on the second-conductivity-type semiconductor layer 330. According to another exemplary embodiment, the first-conductivity-type semiconductor layer 310 may have an uneven upper surface.

The LED 300 may further include a transparent substrate 370 on the optical filter layer 360, and a reflection layer 380 that may cover a side of the optical wavelength conversion layer 350 and/or a side of the light-emitting structure 340. The transparent substrate 370 and the reflection layer 380 respectively correspond to the transparent substrate 170a of the LED 100b illustrated in FIG. 2 and the reflection layer 180 of the LED 100d illustrated in FIG. 5, and redundant descriptions thereof will be omitted. According to another exemplary embodiment, the LED 200 may include a transparent layer between the optical wavelength conversion layer 250 and the optical filter layer 260, instead of the transparent substrate 270.

The LED 300 may be configured as illustrated in FIG. 7 to achieve high power and increase current dispersion efficiency and heat dissipation efficiency.

A first electrode 301 may be electrically connected to the first-conductivity-type semiconductor layer 310 and may be electrically isolated from the second-conductivity-type semiconductor layer 330 and the active layer 320. The first electrode 301 may be electrically connected to the first-conductivity-type semiconductor layer 310 via one or more contact holes CH. The contact hole CH may pass through the second electrode 302, the second-conductivity-type semiconductor layer 330, and the active layer 320 and extend to the inside of the first-conductivity-type semiconductor layer 310. The contact hole CH may be formed using an etching process, for example, inductively coupled plasma-reactive ion etching (ICP-RIE).

An insulating layer 305 may be disposed on the first electrode 301 so as to electrically isolate the first electrode 301 from the second electrode 302, the second-conductivity-type semiconductor layer 330, and the active layer 320. The insulating layer 305 may be disposed between the first electrode 301 and the second electrode 302 and may also be disposed on an inner sidewall of the contact hole CH. The insulating layer 305 may include an insulating material such as $SiO_2$, $SiO_xN_y$, or $Si_xN_y$.

The contact hole CH may expose a contact region C of the first-conductivity-type semiconductor layer 310, and a portion of the first electrode 301 may contact the contact region C of the first-conductivity-type semiconductor layer 310 through the contact hole CH.

In order to reduce the contact resistance between the first electrode 301 and the first-conductivity-type semiconductor layer 310, the number, shape, and pitch of the contact holes CH or the exposed area of the first-conductivity-type semiconductor layer 310 may be appropriately selected. The contact holes CH may be arranged in rows and columns in various forms to improve the current flow. The number and size of the contact holes CH may be appropriately adjusted so that the area of the contact region C becomes about 0.1% to about 20% of the planar area of the light-emitting structure 340. For example, the area of the contact region C may be about 0.5% to about 15%, or about 1% to about 10% of the planar area of the light-emitting structure 340. When the area of the contact region C is less than about 0.1% of the planar area of the light-emitting structure 340, the current dispersion is not uniform, thus degrading the light-emitting characteristics. When the area of the contact region C is about 20% or more of the planar area of the light-emitting structure 340, the light-emitting area of the light-emitting structure 340 is relatively reduced, thus degrading the light-emitting characteristics and reducing the brightness of the LED 300.

A diameter of the contact region C of the first-conductivity-type semiconductor layer 310 may be in the range of about 1 µm to about 50 µm, and the number of the contact holes CH may be 1 to 48,000 according to the entire planar area of the light-emitting structure 340. The number of the contact holes CH may be 2 to 45,000, 5 to 40,000, or 10 to 35,000. The distance between the contact holes CH may be in the range of about 10 µm to about 1,000 µm, about 50 µm to about 700 µm, about 100 µm to about 500 µm, or 150 µm to about 400 µm. The contact holes CH may be arranged in a matrix form with rows and columns.

When the distance between the contact holes CH is less than 10 µm, the number of the contact holes CH increases and the light-emitting area of the light-emitting structure 340 relatively decreases, thus reducing the light-emitting efficiency. When the distance between the contact holes CH is greater than 1,000 µm, the current diffusion becomes difficult, thus reducing the light-emitting efficiency. The depth of the contact holes CH may be different depending on the thicknesses of the second electrode 302, the second-conductivity-type semiconductor layer 330, and the active layer 320 and may be in the range of about 0.1 µm to about 5.0 µm. The second electrode 302 may be disposed under the second-conductivity-type semiconductor layer 330 and be electrically connected to the second-conductivity-type semiconductor layer 330. The second electrode 302 may have a pad-forming region E that extends outward from the light-emitting structure 340 and is exposed externally. An electrode pad 304 may be disposed on the pad-forming region E so as to connect the external terminal to the second electrode 302. Although only one pad-forming region E is illustrated, a plurality of electrode forming regions E may be formed if necessary. The pad-forming region E may be disposed at one edge of the light-emitting structure 340 to increase the light-emitting area.

An etching stopper 306 may be disposed around the electrode pad 304. The etching stopper 306 may include an insulating material and may be formed in the pad-forming region E after the formation of the light-emitting structure 340 and before the formation of the second electrode 302. The etching stopper 306 may serve as an etching stopper during an etching process for the pad-forming region E.

The first electrode 301 may include a material that forms an ohmic contact with the first-conductivity-type semiconductor layer 310 and has a high reflectivity. The first electrode 301 may include a material such as Li, Ca, LiF/Ca, LiF/Al, Al, Ag, Mg, or Au.

Figure 8:
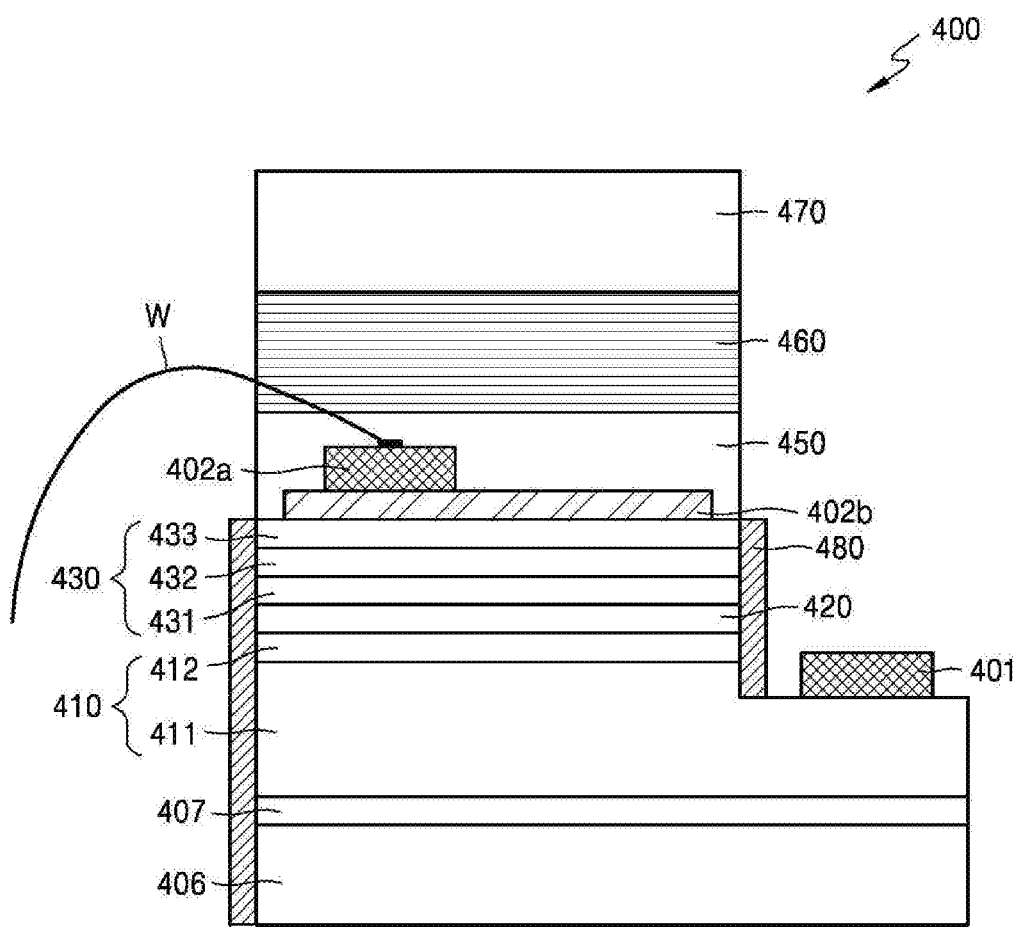
FIG. 8 is a cross-sectional view of a part of an LED according to another exemplary embodiment of the inventive concept.

FIG. 8 is a cross-sectional view of a part of an LED 400 according to another exemplary embodiment of the inventive concept.

Referring to FIG. 8, the LED 400 may include a substrate 406, and a first-conductivity-type semiconductor layer 410, an active layer 420, and a second-conductivity-type semiconductor layer 430, which are sequentially arranged on the substrate 406. A buffer layer 407 may be disposed between the substrate 406 and the first-conductivity-type semiconductor layer 410.

The substrate 406 may be an insulating substrate such as a sapphire substrate. However, the substrate 406 is not limited thereto, and the substrate 406 may be a conductive substrate or a semiconductor substrate. For example, the substrate 406 may include SiC, Si, $MgAl_2O_4$, MgO, $LiAlO_2$, $LiGaO_2$, or GaN.

The buffer layer 407 may include $In_xAl_yGa_{1-x-y}N$ ($0 \leq x \leq 1$, $0 \leq y \leq 1$). For example, the buffer layer 407 may include GaN, AlN, AlGaN, or InGaN. The buffer layer 407 may have a multilayer structure formed by combining a plurality of layers or may include a layer having a composition that gradually changes.

The first-conductivity-type semiconductor layer 410, the active layer 420, and the second-conductivity-type semiconductor layer 430 of the LED 400 illustrated in FIG. 8 may respectively correspond to the first-conductivity-type semiconductor layer 110, the active layer 120, and the second-conductivity-type semiconductor layer 130 of the LED 100 illustrated in FIG. 1, and redundant descriptions thereof will be omitted. The active layer 120 in the exemplary embodiment of FIG. 1 is stacked on the entire surface of the first-conductivity-type semiconductor layer 110, but the active layer 420 in the exemplary embodiment of FIG. 8 is disposed on a portion of the first-conductivity-type semiconductor layer 410.

The LED 400 may further include a first electrode 401 disposed on another portion of the first-conductivity-type semiconductor layer 410, and an ohmic contact layer 402b and a second electrode 402a sequentially disposed on the second-conductivity-type semiconductor layer 430.

The first electrode 401 may include a material such as Ag, Ni, Al, Cr, Rh, Pd, Ir, Ru, Mg, Zn, Pt, or Au, but is not limited thereto. The first electrode 401 may have a single layer structure or a multilayer structure having two or more layers. The LED 400 may further include a pad electrode layer on the first electrode 401. The pad electrode layer may be a metal layer including at least one of Au, Ni, or Sn.

The ohmic contact layer 402b may be transparent and conductive so that the light generated by the active layer 420 is emitted upward. The ohmic contact layer 402b may be a metal layer, such as Ag, Au, or Al, a transparent conductive oxide layer, or a nitride layer. For example, the ohmic contact layer 402b may include at least one of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminium-doped zinc oxide (AZO), gallium-doped zinc oxide (GZO), $In_4Sn_3O_{12}$, or zinc magnesium oxide $(Zn_{(1-x)}Mg_xO)$ ($0 \leq x \leq 1$).

The second electrode 402a may include at least one of Al, Au, Cr, Ni, Ti, or Sn. The second electrode 402a may be electrically connected to an external device (e.g., a lead frame, a package substrate and so on.) via a bonding wire W.

The LED 400 may further include an optical wavelength conversion layer 450 on the ohmic contact layer 402b and on the second electrode 402a. The LED 400 may also include an optical filter layer 460 on the optical wavelength conversion layer 450.

The optical wavelength conversion layer 450 may be configured to absorb first light having a first peak wavelength, which is emitted from the active layer 402, and emit second light having a second peak wavelength. The first light may pass through the ohmic contact layer 402b and the second electrode 402a and be incident on the optical wavelength conversion layer 450. The bonding wire W bonded to the second electrode 402a may pass through the optical wavelength conversion layer 450. That is, a portion of the bonding wire W may pass through the optical wavelength conversion layer 450. The optical wavelength conversion layer 450 of FIG. 8 corresponds to the optical wavelength conversion layer 150 of FIG. 1, and a detailed description thereof will be omitted.

The optical filter layer 460 may reflect the first light having the first peak wavelength which is emitted from the active layer 420, and transmit the second light having the second peak wavelength which is emitted from the optical wavelength conversion layer 450. The optical filter layer 460 corresponds to the optical filter layer 160 of FIG. 1, and a detailed description thereof will be omitted.

The LED 400 may further include a transparent substrate 470 on the optical filter layer 460, and a reflection layer 480 that covers a side of the active layer 420. The transparent substrate 470 may function as a support substrate for forming the optical filter layer 460. The reflection layer 480 may substantially prevent the light generated by the active layer 420 from leaking toward the side surface thereof and improve the light-emitting efficiency of the second light having the second peak wavelength. As illustrated in FIG. 8, the reflection layer 480 may cover the sides of the first-conductivity-type semiconductor layer 410, the active layer 420, and the second-conductivity-type semiconductor layer 430 and may also extend to the sides of the substrate 406 and the buffer layer 407. The transparent substrate 470 and the reflection layer 480 respectively correspond to the transparent substrate 170a of the LED 100b illustrated in FIG. 2 and the reflection layer 180 of the LED 100d illustrated in FIG. 5, and detailed descriptions thereof will be omitted.

Figure 9:
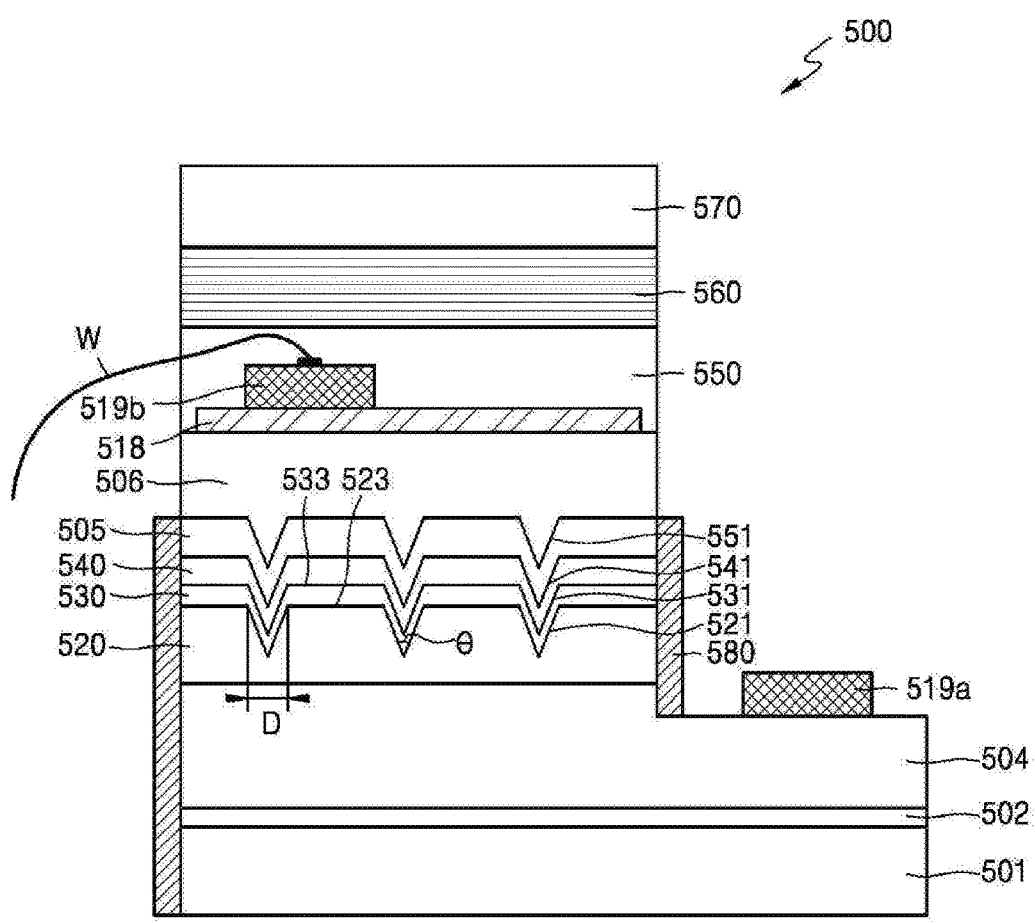
FIG. 9 is a cross-sectional view of a part of an LED according to another exemplary embodiment of the inventive concept.

FIG. 9 is a cross-sectional view of a part of an LED 500 according to another exemplary embodiment of the inventive concept.

Referring to FIG. 9, the LED 500 may include a substrate 501, and a first-conductivity-type semiconductor layer 504, an active layer 505, and a second-conductivity-type semiconductor layer 506, which are sequentially arranged on the substrate 501. A buffer layer 502 may be disposed between the substrate 501 and the first-conductivity-type semiconductor layer 504. The first-conductivity-type semiconductor layer 504, the active layer 505, and the second-conductivity-type semiconductor layer 506 of the LED 500 illustrated in FIG. 9 may correspond to respective ones of the first-conductivity-type semiconductor layer 110, the active layer 120, and the second-conductivity-type semiconductor layer 130 of the LED 100 illustrated in FIG. 1, and redundant descriptions thereof will be omitted.

The substrate 501 may be an insulating substrate such as a sapphire substrate. However, the substrate 501 is not limited thereto, and the substrate 501 may be a conductive substrate or a semiconductor substrate. For example, the substrate 501 may include SiC, Si, $MgAl_2O_4$, MgO, $LiAlO_2$, $LiGaO_2$, or GaN.

The buffer layer 502 may include $In_xAl_yGa_{1-x-y}N$ ($0 \leq x \leq 1$, $0 \leq y \leq 1$). For example, the buffer layer 502 may include GaN, AlN, AlGaN, or InGaN. The buffer layer 502 may have a thickness of about 0.1 nm to about 500 nm. The buffer layer 502 may include $ZrB_2$, $HfB_2$, ZrN, HfN, or TiN. The buffer layer 502 may include a plurality of layers or may include a layer whose composition gradually changes.

The first-conductivity-type semiconductor layer 504 and the second-conductivity-type semiconductor layer 506 may have a single-layer structure. In some embodiments, if necessary, the first-conductivity-type semiconductor layer 504 and the second-conductivity-type semiconductor layer 506 may have multilayer structures with different compositions or thicknesses. For example, at least one of the first-conductivity-type semiconductor layer 504 and the second-conductivity-type semiconductor layer 506 may include a carrier injection layer capable of improving electron and/or hole injection efficiency and may have various superlattice structures.

The LED 500 may further include a V-pit forming layer 520 on the first-conductivity-type semiconductor layer 504. The V-pit forming layer 520 may be adjacent to the first-conductivity-type semiconductor layer 504. The V-pit forming layer 520 may have a V-pit density of about $1 \times 10^8$ cm$^{-2}$ to about $5 \times 10^9$ cm$^{-2}$. According to some exemplary embodiments, the V-pit forming layer 520 may have a thickness of about 200 nm to about 800 nm. An inlet of a V-pit 521 may have a width D of about 200 nm to about 800 nm. Because the vertical cross-section of the V-pit 521 has a V-like shape, the V-pit 521 is generally referred to as a V-pit. The V-pit 521 formed in the V-pit forming layer 520 may have an apex angle (θ) of about 10 degrees to about 90 degrees, for example, about 20 degrees to about 80 degrees.

According to the present exemplary embodiment, the V-pit 521 may have a growth plane ((0001) plane) substantially parallel to a substrate plane, and a growth plane ((1-101) plane, (11-22) plane, or other inclined crystal plane) inclined with respect to the substrate plane at the same time. The V-pit 521 may be formed around a penetration potential passing through the light-emitting structure and prevent a current from concentrating around the penetration potential.

The V-pit forming layer 520 may include GaN or doped GaN.

A position at which the V-pit 521 is formed in the V-pit forming layer 520 may be adjusted by a growth temperature. That is, when the growth temperature is relatively low, the formation of the V-pit 521 may start at a lower position. On the contrary, when the growth temperature is relatively high, the formation of the V-pit 521 may start at a higher position.

Assuming that the V-pit forming layer 520 has substantially the same height, an upper width of the V-pit 521 may further increase if the formation of the V-pit 521 is started at a lower position.

The LED 500 may further include a film quality enhancement layer 530 on the V-pit 520. The film quality enhancement layer 530 may have a composition of $M_xGa_{1-x}N$. Herein, M may be Al or In, and x may be 0.01≤x≤0.3. In some exemplary embodiments, x may be 0.02≤x≤0.08. If the value of x is excessively small, the film quality enhancement effect may be insufficient. On the contrary, if the value of x is excessively large, the light-emitting characteristics may be deteriorated. In the film quality enhancement layer 530, the value of x may be constant. Alternatively, the film quality enhancement layer 530 may have a multilayer structure in which a GaN layer and an $M_xGa_{1-x}N$ layer (where M is Al or In and 0.01≤x≤0.3) are alternately stacked. Alternatively, the film quality enhancement layer 530 may be a superlattice layer in which a GaN layer and an $M_xGa_{1-x}N$ layer (where M is Al or In and 0.01≤x≤0.3) are alternately stacked. The film quality enhancement layer 530 may have a thickness of about 20 nm to about 100 nm.

The film quality enhancement layer 530 may be substantially entirely formed along an upper surface 523 of the V-pit forming layer 520. In addition, the film quality enhancement layer 530 may have a substantially constant thickness in a direction perpendicular to the upper surface 523 of the V-pit generating layer 520.

The film quality enhancement layer 530 may fill at least a portion of the V-pit 521 by covering the inside of the V-pit 521 of the V-pit forming layer 520 to a predetermined thickness. A V-pit 531 of the film quality enhancement layer 530 may be recessed into the V-pit 521 of the V-pit forming layer 520. The thickness of the film quality enhancement layer 530 in a direction perpendicular to the upper surface 523 of the V-pit forming layer 520 may be about 5% to about 20% of the thickness of the V-pit forming layer 520.

Dimensions of the V-pit 531 formed in the film quality enhancement layer 530 may be substantially equal or similar to dimensions of the V-pit 521 of the V-pit forming layer 520.

An upper surface 533 of the film quality enhancement layer 530 may have an improved surface roughness as compared with an upper surface 523 of the V-pit forming layer 520. For example, the surface roughness of the upper surface 533 of the film quality enhancement layer 530 may be about 60% or less of the surface roughness of the upper surface 123 of the V-pit forming layer 520. The surface roughness may be measured using an atomic force microscope (AFM). The surface roughness may be based on a measurement on the upper surface except for the V-pits 521 and 531. The surface roughness may be determined by measuring a uniformity (flatness) of an interface. For example, the uniformity of the film quality enhancement layer 530 and an interface adjacent thereto may be superior to the uniformity of the V-pit forming layer 520 and an interface adjacent thereto.

By improving the surface roughness of the upper surface 533 of the film quality enhancement layer 530, the surface roughness of a barrier layer and a quantum well layer in the active layer 505 disposed thereon can be improved. As a result, a non-luminous recombination between electrons and holes may be reduced, thus remarkably improving the light-emitting characteristics.

The LED 500 may further include a superlattice layer 540 overlying the film quality enhancement layer 530. The superlattice layer 540 may have a structure in which a plurality of $In_xAl_yGa_{(1-x-y)}N$ layers (0≤x<1, 0≤y<1, 0≤x+y<1) having different compositions or different impurity content are repeatedly stacked, or may include an insulating material layer in part. The superlattice layer 540 may cause uniform light emission to occur in a wide area by accelerating the diffusion of a current.

In the superlattice layer 540, a V-pit 541 may be formed corresponding to the V-pit 531 formed in the film quality enhancement layer 530.

The superlattice layer 540 may fill at least a portion of the V-pit 531 by covering the inside of the V-pit 531 of the V-pit forming layer 530 to a predetermined thickness. A V-pit 541 of the superlattice layer 540 may be recessed into the V-pit 531 of the film quality enhancement layer 530.

The second-conductivity-type semiconductor layer 506 may further include an electron blocking layer (EBL) at a position adjacent to the active layer 505. Another V-pit 551 is formed into the active layer 505 overlapping with the V-pit 541. The EBL may have a structure in which a plurality of $In_xAl_yGa_{(1-x-y)}N$ layers having different compositions are stacked, or may have a single-layer or multilayer structure including $Al_yGa_{(1-y)}N$. Since a band gap of the EBL is greater than a band gap of the active layer 505, the EBL is capable of preventing electrons from crossing the second-conductivity-type semiconductor layer 506.

As the V-pit 521 formed in the V-pit forming layer 520 becomes closer to the thickness direction of each layer, i.e., the second-conductivity-type semiconductor layer 506, the V-shaped valley may become gentle and may become substantially flat due to the superlattice layer 540 or the second-conductivity-type semiconductor layer 506.

The LED 500 may further include a first electrode 519a disposed on a portion of the first-conductivity-type semiconductor layer 504, and an ohmic contact layer 518 and a second electrode 519b sequentially disposed on the second-conductivity-type semiconductor layer 506.

The first electrode 519a is not limited thereto. The first electrode 519a may include a material such as Ag, Ni, Al, Rh, Pd, Ir, Ru, Mg, Zn, Pt, Au and may have a single-layer structure or a multilayer structure having two or more layers. The LED 400 may further include a pad electrode layer on the first electrode 519a. The pad electrode layer may include at least one of Au, Ni, or Sn.

The ohmic contact layer 518 may be transparent and conductive so that the light generated by the active layer 505 is emitted upward. The ohmic contact layer 518 may be a metal layer, such as Ag, Au, and Al, a transparent conductive oxide layer, or a nitride layer. For example, the ohmic contact layer 518 may include at least one of indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminium-doped zinc oxide (AZO), gallium-doped zinc oxide (GZO), $In_4Sn_3O_{12}$, or zinc magnesium oxide $(Zn_{(1-x)}Mg_xO)$ $(0≤x≤1)$.

The second electrode 519b may include at least one of Al, Au, Cr, Ni, Ti, or Sn. The second electrode 519b may be electrically connected to an external device (e.g., a lead frame, a package substrate, etc.) via a bonding wire W.

The LED 500 may further include an optical wavelength conversion layer 550 on the ohmic contact layer 518 and the second electrode 519b, and an optical filter layer 560 on the optical wavelength conversion layer 550.

The optical wavelength conversion layer 550 may be disposed on the ohmic contact layer 518 and the second electrode 519b and may be configured to absorb the first light having the first peak wavelength, which is emitted from the active layer 505, and emit the second light having the second peak wavelength. The first light may pass through the ohmic contact layer 518 and the second electrode 519b and be incident on the optical wavelength conversion layer 550. The bonding wire W bonded to the second electrode 419b may be disposed to pass through the optical wavelength conversion layer 550. That is, a portion of the bonding wire W may pass through the optical wavelength conversion layer 550. The optical wavelength conversion layer 550 corresponds to the optical wavelength conversion layer 150 of FIG. 1, and a detailed description thereof will be omitted.

The optical filter layer 560 may reflect the first light having the first peak wavelength which is emitted from the active layer 505, and transmit the second light having the second peak wavelength which is emitted from the optical wavelength conversion layer 550. The optical filter layer 560 corresponds to the optical filter layer 160 of FIG. 1, and a detailed description thereof will be omitted.

The LED 500 may further include a transparent substrate 570 on the optical filter layer 560, and a reflection layer 580 that covers a side of at least the active layer 505. The transparent substrate 170a may function as a support substrate for forming the optical filter layer 560. The reflection layer 580 may be provided to prevent the light generated by at least the active layer 505 from leaking toward the side surface thereof and improve the light-emitting efficiency of the second light having the second peak wavelength. As illustrated in FIG. 9, the reflection layer 580 may cover the sides of the first-conductivity-type semiconductor layer 504, the V-pit forming layer 520, the film quality enhancement layer 530, the superlattice layer 540, the active layer 505, and the second-conductivity-type semiconductor layer 506 and may extend to the sides of the substrate 501 and the buffer layer 502. The transparent substrate 570 and the reflection layer 580 respectively correspond to the transparent substrate 170a of the LED 100b illustrated in FIG. 2 and the reflection layer 180 of the LED 100d illustrated in FIG. 5, and redundant descriptions thereof will not be repeated.

Figure 10:
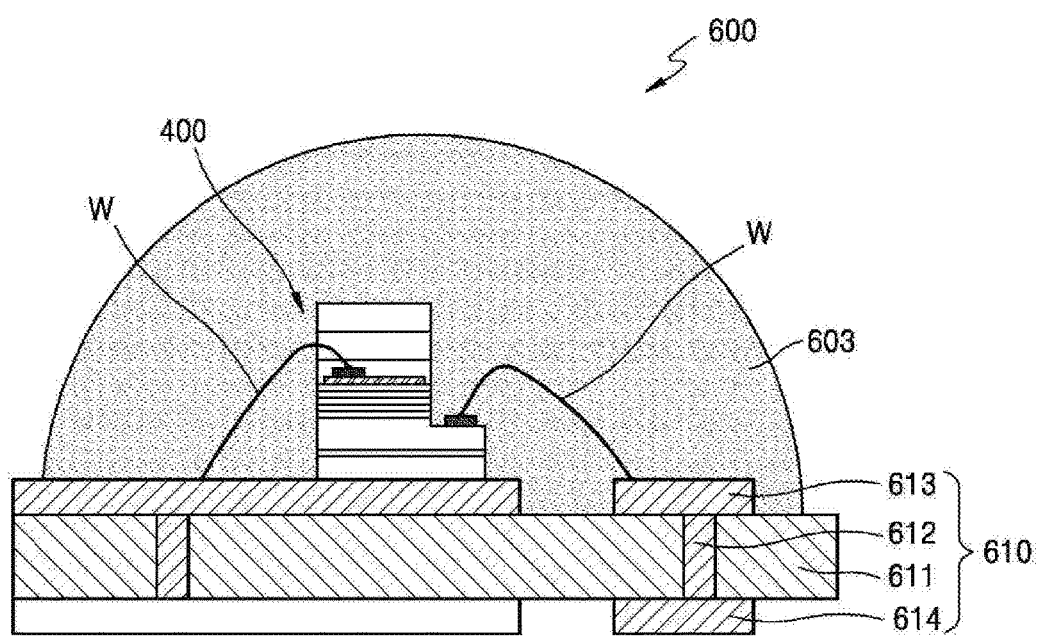
FIG. 10 is a cross-sectional view of an LED package according to another exemplary embodiment of the inventive concept.

FIG. 10 is a cross-sectional view of an LED package 600 according to another exemplary embodiment of the inventive concept.

Referring to FIG. 10, the LED package 600 may include the LED 400, a part of which is illustrated in FIG. 8. Since the LED 400 has been described above with reference to FIG. 8, a redundant description thereof will be omitted.

The LED package 600 may further include a package substrate 610 and an encapsulation body 603. The LED 400 may be mounted on the package substrate 610 and be electrically connected to the package substrate 610 via the bonding wire W.

The package substrate 610 may include a substrate body 611, an upper electrode 613, a lower electrode 614, and a through-electrode 612 that connects the upper electrode 613 to the lower electrode 614. A body of the package substrate 610 may include a resin, a ceramic, or a metal, and the upper or lower electrode 613 or 614 may be a metal layer including Au, Cu, Ag, or Al. For example, the package substrate 610 may be a printed circuit board (PCB), a metal core PCB (MCPCB), a metal-based PCB (MPCB), or a flexible PCB (FPCB), and the configuration of the package substrate 610 may be employed in various forms.

The encapsulation body 603 may have a dome-shaped lens structure with a convex upper surface. However, according to some embodiments, an orientation angle of a light emitted through the upper surface of the encapsulation body 603 can be adjusted by forming a lens structure with a convex or concave surface.

Figure 11:
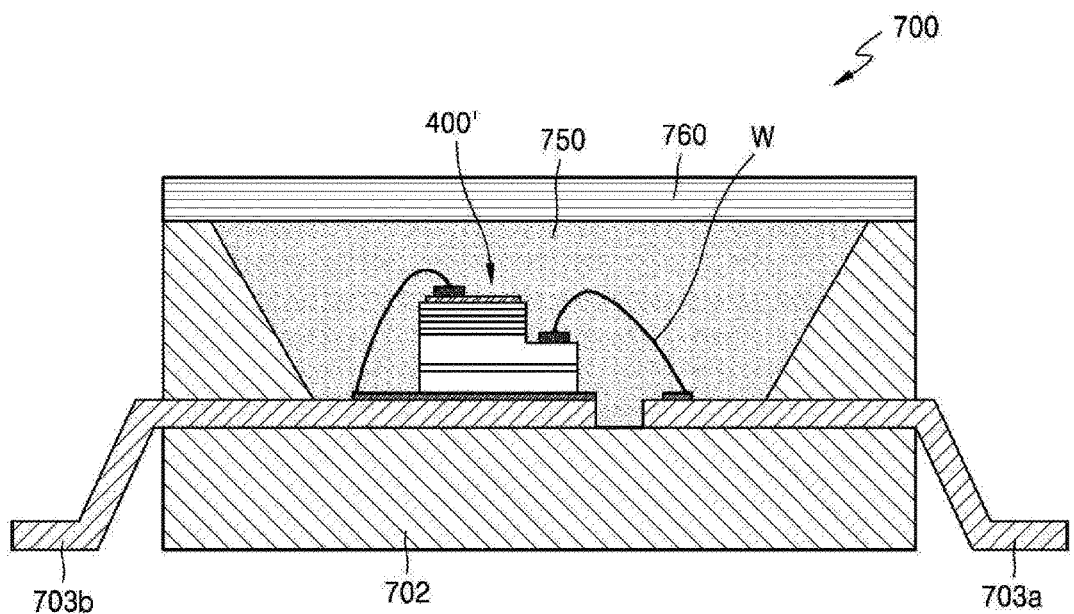
FIG. 11 is a cross-sectional view of an LED package according to another exemplary embodiment of the inventive concept.

FIG. 11 is a cross-sectional view of an LED package 700 according to another exemplary embodiment of the inventive concept.

Referring to FIG. 11, the LED package 700 may include an LED 400' that is substantially the same as the LED 400 of FIG. 8 from which the optical wavelength conversion layer, the optical filter layer, and the transparent substrate are removed. The description of the LED 400 illustrated in FIG. 8 will substitute for the description of the LED 400'. The LED 400' may emit first light having a first peak wavelength. The first peak wavelength may be included in a wavelength band of blue visible light or a wavelength band of ultraviolet light. For example, the LED 400' may be a blue LED. The LED package 700 may further include a package body 702 and a pair of lead frames 703a and 703b.

The LED 400' may be mounted on the lead frames 703a and 703b, and electrodes may be electrically connected to the lead frames 703a and 703b through wires W. According to another exemplary embodiment, the LED 400' may be mounted on a region other than the lead frames 703a and 703b, for example, the package body 702.

The package body 702 may have a cup-shaped groove so as to improve the light reflection efficiency of the LED package 700. The package body 702 may be a resin including a high-reflectivity powder. The high-reflectivity powder included in the package body 702 may prevent the first light emitted by the LED 400' from being absorbed into the package body 702 or leaking toward the side of the LED package 700, thus increasing the light brightness of the LED package 700. The high-reflectivity powder may include a metal powder having high reflectivity, for example, an Al or Ag powder. The high-reflectivity metal powder may be appropriately included in the range in which the package body 702 is maintained as an insulating material. In addition, the high-reflectivity powder may include a ceramic powder, for example, at least one of $TiO_2$, $Al_2O_3$, $Nb_2O_5$, $Al_2O_3$, or ZnO.

The package body 702 may be a curing resin or a semi-curing resin. The curing resin may be flowable before curing and may be curable when heat energy or ultraviolet energy is applied thereto. The semi-curing state is a state that is not completely cured, but may mean a state in which curing is sufficiently progressed to have handleability or processability. The semi-cured resin may be pressed at an appropriate temperature and attached to the surface of the LED 400'.

According to some exemplary embodiments, the package body 702 may be made of the same material and may be one body. That is, the package body 702 may be formed by molding the same material.

The package body 702 may have electrically insulating properties. For example, the package body 702 may include a silicon resin, an epoxy resin, or any mixtures thereof The LED package 700 may further include an optical wavelength conversion layer 750 that contacts an inner sidewall of the package body 702 and contacts the upper surface of the LED 400' in a space defined by the package body 702.

The optical wavelength conversion layer 750 may encapsulate the LED 400' and the wire W. The optical wavelength conversion layer 750 may absorb first light having a first peak wavelength, which is emitted from the LED 400', and emit second light having a second peak wavelength. The second peak wavelength may be different from the first peak wavelength and may be included in a wavelength band of a second color of visible light which is different from a first color. The second color may be one of a red color, a green color, and a yellow color.

Various materials, such as phosphors and/or quantum dots, may be used as a wavelength conversion material for converting the wavelength of the first light emitted from the LED 400'.

The phosphors used for the optical wavelength conversion layer 750 may have the following empirical formulas and colors.

Oxide-based: yellow color and green color $Y_3Al_5O_{12}$:Ce, $Tb_3Al_5O_{12}$:Ce, $Lu_3Al_5O_{12}$:Ce Silicate-based: yellow color and green color $(Ba,Sr)_2SiO_4$:Eu, yellow color and orange color $(Ba,Sr)_3SiO_5$:Ce Nitride-based: green color β-SiAlON:Eu, yellow color $La_3Si_6O_{11}$:Ce, orange color α-SiAlON:Eu, red color $CaAlSiN_3$:Eu, $Sr_2Si_5N_8$:Eu, $SrSiAl_4N_7$:Eu, $SrLiAl_3N_4$:Eu, $Ln_{4-x}(Eu_zM_{1-z})_xSi_{12-y}Al_yO_{3+x+y}N_{18-x-y}$ ($0.5 \leq x \leq 3$, $0 < z < 0.3$, $0 < y \leq 4$)

Herein, Ln may be at least one of group IIIa elements or rare-earth elements, and M may be at least one of calcium (Ca), barium (Ba), strontium (Sr), and magnesium (Mg).

Fluoride-based: KSF-based red color $K_2SiF_6$:$Mn_4^+$, $K_2TiF_6$:$Mn_4^+$, $NaYF_4$:$Mn_4^+$, $NaGdF_4$:$Mn_4^+$, $K_3SiF_7$:$Mn_4^+$ The composition of the phosphor needs to basically conform with stoichiometry, and the respective elements may be substituted by other elements included in the respective groups of the periodic table. For example, strontium (Sr) may be substituted by at least one of barium (Ba), calcium (Ca), or magnesium (Mg) of alkaline-earth group II, and Y may be substituted by at least one of terbium (Tb), lutetium (Lu), scandium (Sc), or gadolinium (Gd). In addition, europium (Eu), which is an activator, may be substituted by at least one of cerium (Ce), terbium (Tb), praseodymium (Pr), erbium (Er), or ytterbium (Yb) according to a desired energy level. The activator may be applied solely or a sub activator may be additionally applied for the modification of phosphor characteristics.

The wavelength conversion layer 750 may include a quantum dot (QD) as the wavelength conversion material, instead of the phosphor or in combination with the phosphor.

The LED package 700 may further include an optical filter layer 760 on the optical wavelength conversion layer 750. The optical filter layer 760 may extend to cover the upper surface of the package body 720.

The optical filter layer 760 may reflect the first light having the first peak wavelength which is emitted from the LED 400', and transmit the second light having the second peak wavelength emitted from the optical wavelength conversion layer 750.

The optical filter layer 760 may have a multilayer reflection structure in which a plurality of dielectric films having different refractive indexes are alternately stacked. For example, the optical filter layer 760 may have a multilayer reflection structure in which a first dielectric film having a first refractive index (n1) and a first thickness (d1) and a second dielectric film having a second refractive index (n2) and a second thickness (d2) are alternately and repeatedly stacked. According to an exemplary embodiment, the optical filter layer 160 may be a DBR configured to reflect the first light having the first peak wavelength which is emitted from the LED 400'.

The multilayer reflection structure may be formed by repeatedly stacking a plurality of dielectric films having different refractive indexes twice or more. Each of the first and second dielectric films in the multilayer reflection structure may include oxide or nitride (e.g., $SiO_2$, SiN, $SiO_xN_y$, $TiO_2$, $Nb_2O_5$, $Si_3N_4$, $Al_2O_3$, TiN, AlN, $ZrO_2$, TiAlN, TiSiN, etc.), or any mixtures thereof. For example, the first dielectric film may include silicon oxide ($SiO_2$), and the second dielectric film may include titanium oxide ($TiO_2$) or niobium oxide ($Nb_2O_5$).

A refractive index of each of the first and second dielectric films may be determined within the range of about 1.4 to about 3.0. When the first peak wavelength of the first light emitted by the LED 400' is λ1, the thicknesses of the first and second dielectric films are λ1/4n1 and λ2/4n2, respectively.

Figure 12:
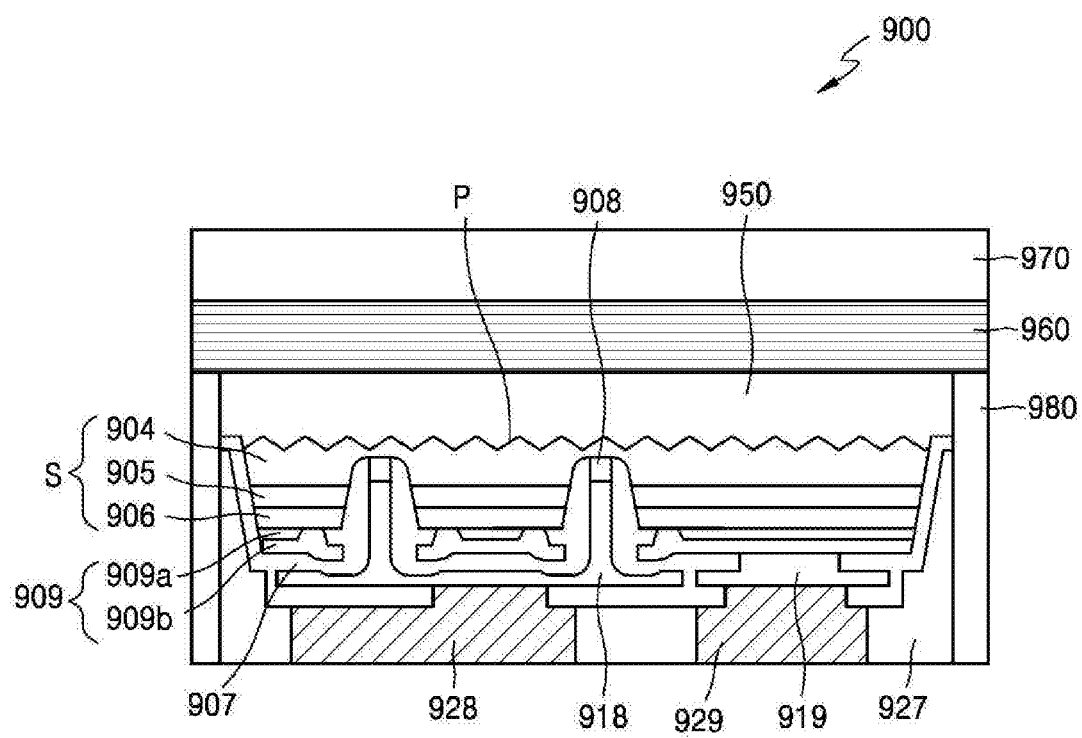
FIG. 12 is a cross-sectional view of an LED package according to another exemplary embodiment of the inventive concept.

FIG. 12 is a cross-sectional view of an LED package 900 according to another exemplary embodiment of the inventive concept.

Referring to FIG. 12, the LED package 900 may include a light-emitting structure S, an optical wavelength conversion layer 950, and an optical filter layer 960. The light-emitting structure S may include a first-conductivity-type semiconductor layer 904, an active layer 905, and a second-conductivity-type semiconductor layer 906, which are sequentially stacked. The light-emitting structure S, the optical wavelength conversion layer 950, and the optical filter layer 960 of the LED package 900 illustrated in FIG. 12 may respectively correspond to the light-emitting structure 140, the optical wavelength conversion layer 150, and the optical filter layer 160 of the LED 100 illustrated in FIG.

1, and redundant descriptions thereof will be omitted. The stacking order of the light-emitting structure S illustrated in FIG. 12 is substantially identical to the stacking order of the light-emitting structure 140 illustrated in FIG. 4. That is, the first-conductivity-type semiconductor layer 904 may be disposed on the active layer 905, and the active layer 905 may be disposed on the second-conductivity-type semiconductor layer 906. In addition, the first-conductivity-type semiconductor layer 904 may have an uneven upper surface so as to improve the light extraction efficiency of the LED package 900 and the single-crystal quality of the light-emitting structure S.

The LED package 900 may further include a transparent substrate 970 on the optical filter layer 960, and a reflection layer 980 that covers a side of the optical wavelength conversion layer 950. The reflection layer 980 may cover a side of a lateral encapsulation 927. The reflection layer 980 may cover the sides of the optical filter layer 960 and the transparent substrate 970 depending on the manufacturing process. The transparent substrate 970 and the reflection layer 980 respectively correspond to the transparent substrate 170a of the LED 100b illustrated in FIG. 2 and the reflection layer 180 of the LED 100d illustrated in FIG. 5, and redundant descriptions thereof will be omitted. According to another exemplary embodiment, the LED package 900 may include a transparent layer between the optical wavelength conversion layer 950 and the optical filter layer 960, instead of the transparent substrate 970.

The LED package 900 may further include a first electrode electrically connected to the first-conductivity-type semiconductor layer 904, and a second electrode electrically connected to the second-conductivity-type semiconductor layer 906.

The second electrode may include a second electrode unit 909 including an ohmic contact unit 909a disposed under the second-conductivity-type semiconductor layer 906 and directly electrically connected to the second-conductivity-type semiconductor layer 906, and an electrode unit 909b connected to the ohmic contact unit 909a. The second electrode may further include a second pad 919 connected to the second electrode unit 909, and a second metal post 929 connected to the second pad 919 and functioning as an external terminal.

The first electrode may be electrically connected to the first-conductivity-type semiconductor layer 904 via a contact hole passing through the second electrode unit 909, the second-conductivity-type semiconductor layer 906, and the active layer 905. The first electrode may include a first electrode unit 908 directly electrically connected to the first-conductivity-type semiconductor layer 904, a first pad 918 electrically connected to the first electrode unit 908, and a first metal post 928 connected to the first pad 918 and functioning as an external terminal.

The LED package 900 may further include an insulating layer 907 that provides electrical insulation between the first electrode connected to the first-conductivity-type semiconductor layer 904 and the second electrode connected to the second-conductivity-type semiconductor layer 906. The insulating layer 907 may include a reflection structure for reflecting first light generated by the active layer 905.

The LED package 900 may further include a lateral encapsulation 927 that supports the light-emitting structure S and the first and second electrodes, protects the light-emitting structure S and the first and second electrodes from the outside, and provides electrical insulation between the first metal post 928 and the second metal post 929.

The first light generated by the active layer 905 may be reflected inward by the insulating layer 907, the reflection layer 980, and the optical filter layer 960 having reflection characteristics, and be incident on the optical wavelength conversion layer 950, thus increasing the optical wavelength conversion efficiency of the optical wavelength conversion layer 950. The first light having the first peak wavelength, which is generated by the active layer 905, may be converted into second light having a second peak wavelength by the optical wavelength conversion layer 950, and the second light may be emitted to the outside through the optical filter layer 960. Therefore, the LED package 900 may emit a high-purity color light.

FIGS. 13A to 13K are cross-sectional views for describing a method of manufacturing the LED package 900 of FIG. 12, according to an exemplary embodiment of the inventive concept.

Figure 13A:
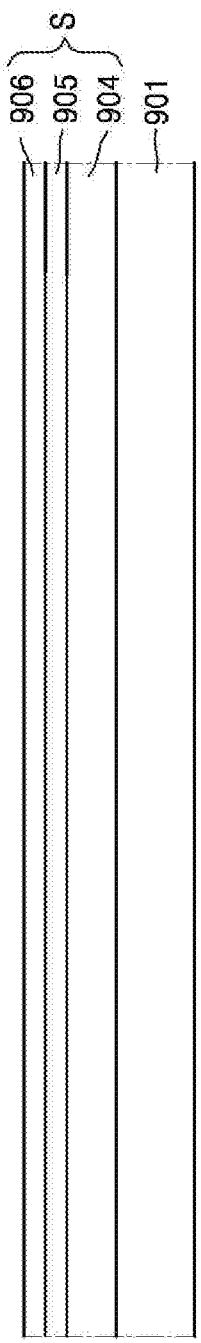

Referring to FIG. 13A, a light-emitting structure S may be formed on a substrate 901 at a wafer level. The light-emitting structure S may be provided by sequentially forming a first-conductivity-type semiconductor layer 904, an active layer 905, and a second-conductivity-type semiconductor layer 906. The substrate 901 may be an insulating substrate such as a sapphire substrate. However, the substrate 901 is not limited thereto and may include SiC, Si, $MgAl_2O_4$, MgO, $LiAlO_2$, $LiGaO_2$, or GaN.

Figure 13B:
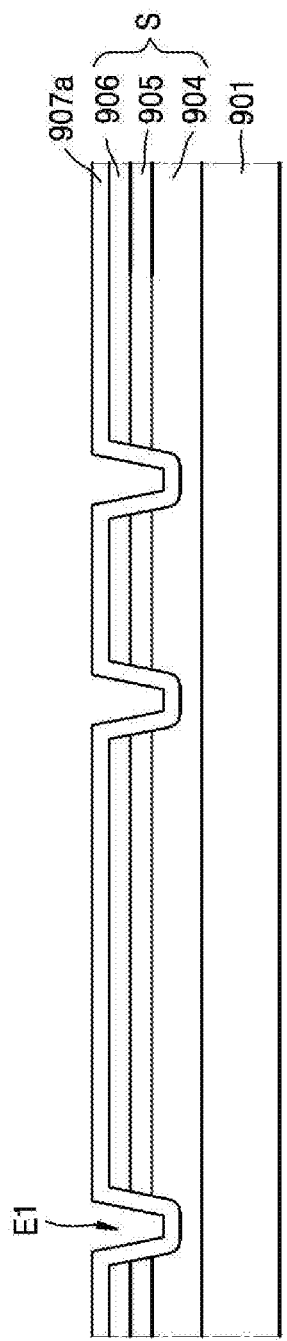

Referring to FIG. 13B, after a mesa etching process is performed to expose a portion E1 of the first-conductivity-type semiconductor layer 904, a first insulating layer 907a may be deposited on the light-emitting structure S. Due to the mesa etching process, one or more mesas may be formed in each LED package.

Referring to FIG. 13C, after a portion of the first insulating layer 907a is etched, a conductive ohmic material may be deposited on the resulting structure to form first and second electrode units 908 and 909. A second insulating layer 907b may be formed on the first insulating layer 907a and the first and second electrode units 908 and 909, which may be partially exposed by an etching process. Each of the first and second electrode units 908 and 909 may be a reflective electrode including one selected from the group consisting of Ag, Al, Ni, Cr, Cu, Au, Pd, Pt, Sn, W, Rh, Ir, Ru, Mg, Zn, and alloys thereof. The second electrode unit 909 may include an ohmic contact unit 909a and an electrode unit 909b.

Figure 13D:
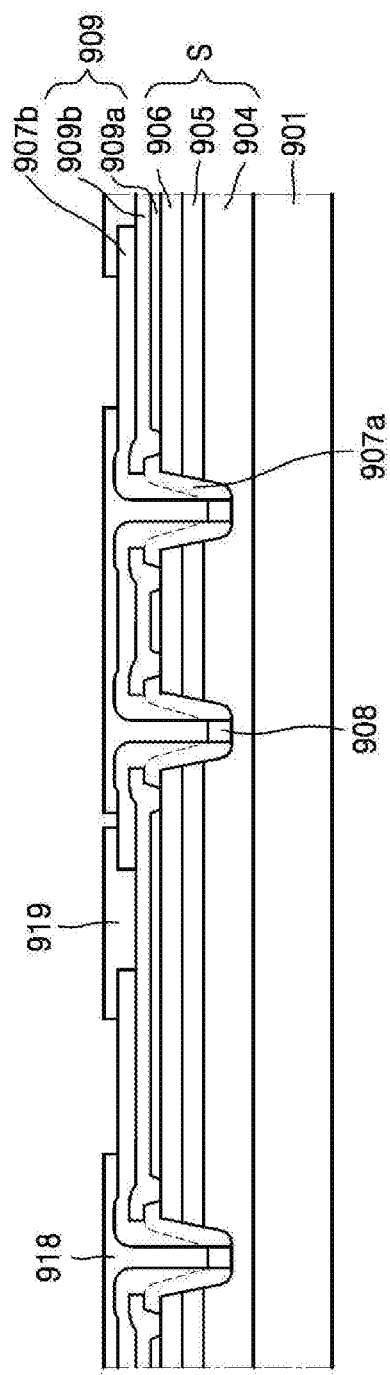

Referring to FIG. 13D, first and second pads 918 and 919 may be formed on the first and second electrode units 908 and 909, respectively. The first and second pads 918 and 919 may be electrically connected to the first and second electrode units 908 and 909, respectively.

Figure 13E:
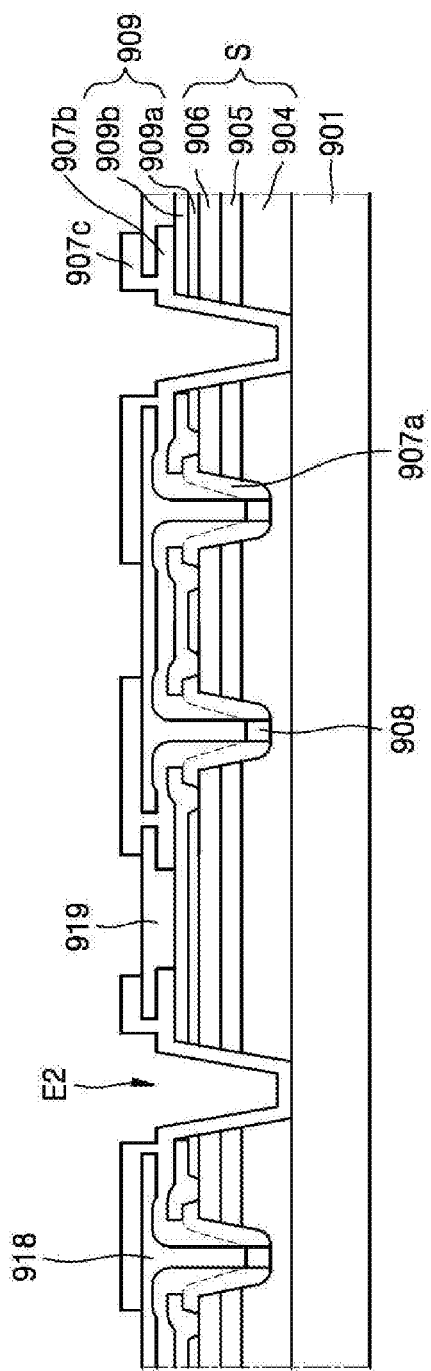

Referring to FIG. 13E, an isolation process may be performed to separate the substrate 901 into individual chips. The isolation process may be performed by a blade, for example. Any other suitable process may be used as long as the process is capable of cutting the light-emitting structure S while the substrate 901 is not cut. Through the isolation process, the light-emitting structure S may be separated into individual chips and be mounted on the substrate 901. The light-emitting structure S obtained by the isolation process may have a trapezoidal shape in which an upper side is shorter than a lower side. This may form an inclined surface at a side of the light-emitting structure S.

A third insulating layer 907c may be formed on the inclined surface of the light-emitting structure S, the first and second pads 918 and 919, and the second insulating layer 907b, and the first and second pads 918 and 919 may be partially exposed. The third insulating layer 907c may provide passivation together with the remaining first and second insulating layers 907a and 907b formed in the previous process.

Figure 13F:
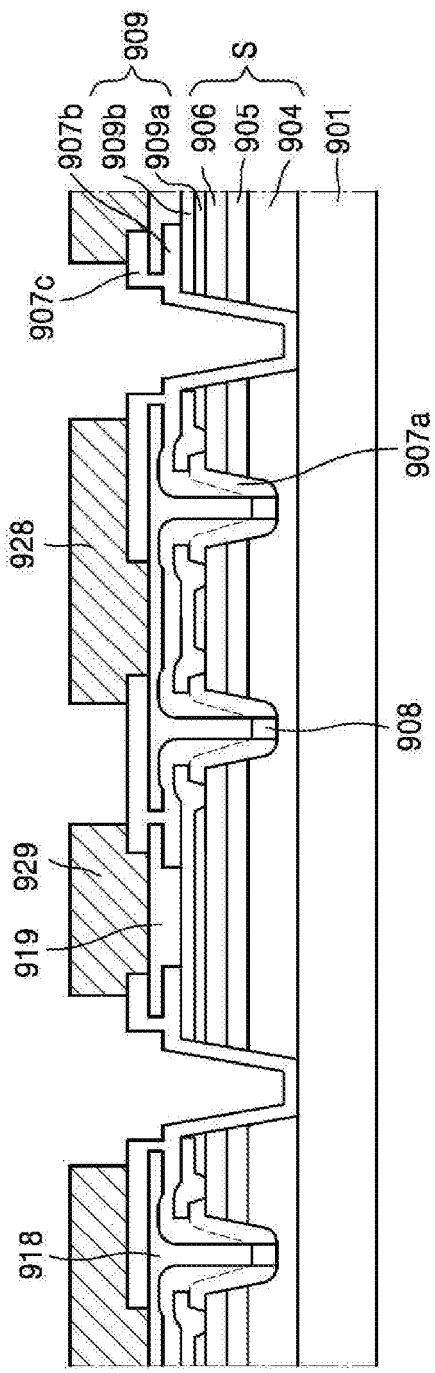

Referring to FIG. 13F, first and second metal posts 928 and 929 may be formed on the first and second pads 918 and 919, respectively. Each of the first and second metal posts 928 and 929 may include copper (Cu), for example. Each of the first and second metal posts 928 and 929 may include a conductive material.

Figure 13G:
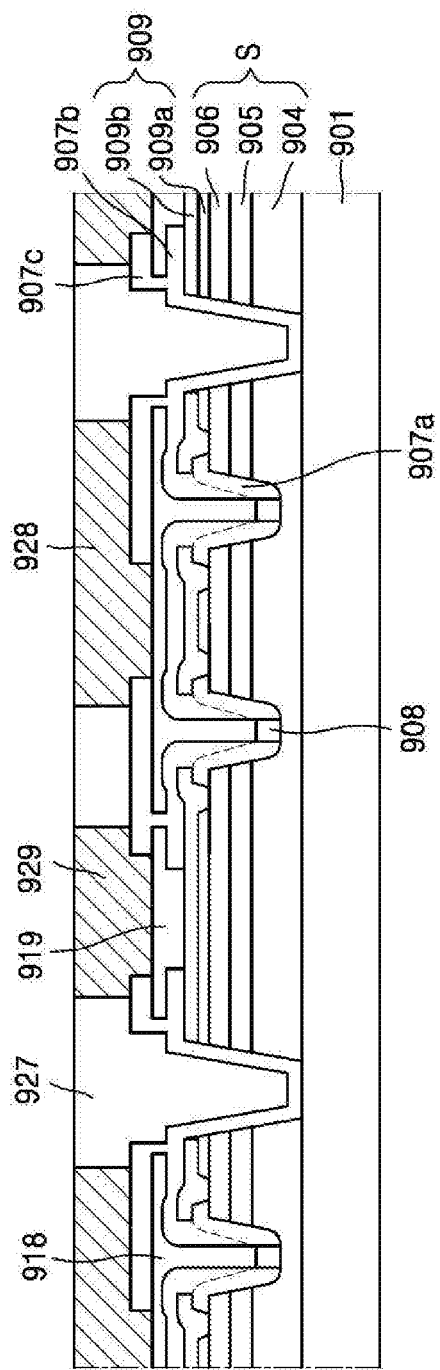

Referring to FIG. 13G, a lateral encapsulation 927 may be formed to fill a gap between the first and second metal posts 928 and 929 and fill a gap between the first and second metal posts 928 and 929 of the adjacent light-emitting structures S.

When the lateral encapsulation 927 is formed, a material of the lateral encapsulation 927 may have high Young's modulus so as to obtain high stiffness and may have a high thermal conductivity so as to discharge heat from the light-emitting structure S. In addition, a light reflective material may be included in the lateral encapsulation 927 so as to reflect a light downward. The light reflective material may include $TiO_2$ or $Al_2O_3$, for example.

The lateral encapsulation 927 may be formed by coating an encapsulation material until upper portions of the first and second metal posts 928 and 929 are covered, and by exposing end portions of the first and second metal posts 928 and 929 using a planarization process such as grinding.

Figure 13H:
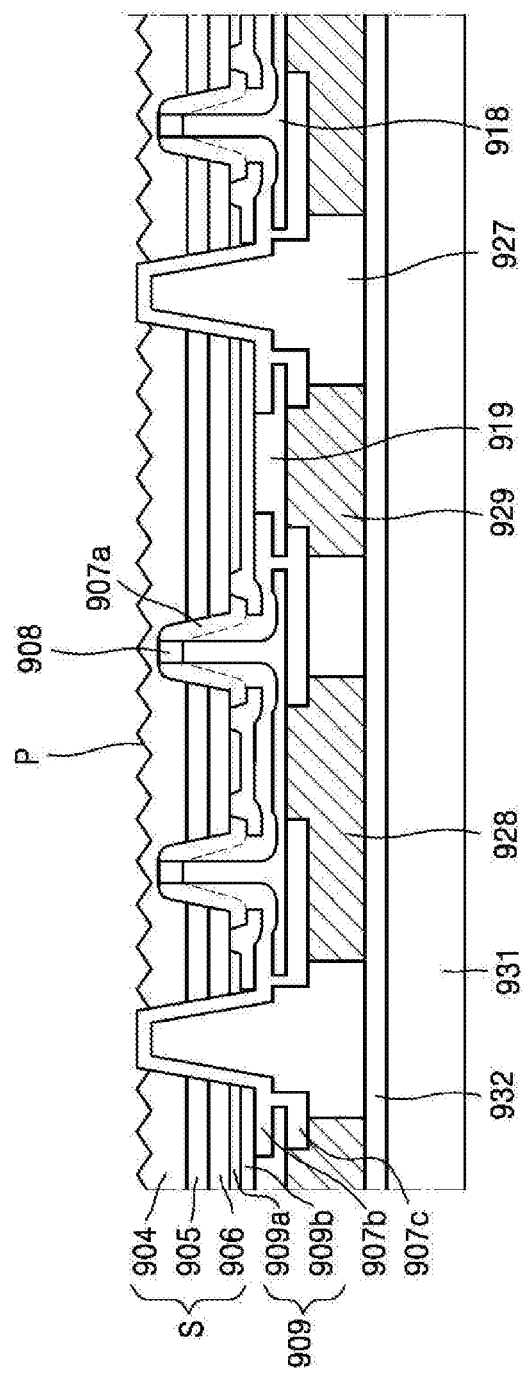

As shown in FIG. 13H, the substrate 901 may then be removed. This process may include a process of temporarily bonding a support substrate 931 to surfaces on which the first and second metal posts 928 and 929 are present. A bonding material 932 such as an ultraviolet curable material may be used. Then, the substrate 901 may be removed by a process such as grinding or laser lift-off. If necessary, a texturing process may be further performed on a portion of the second-conductivity-type semiconductor layer 906 to increase the light extraction efficiency of the LED package. Uneven patterns P may be formed on the upper surface of the second-conductivity-type semiconductor layer 906.

Figure 13I:
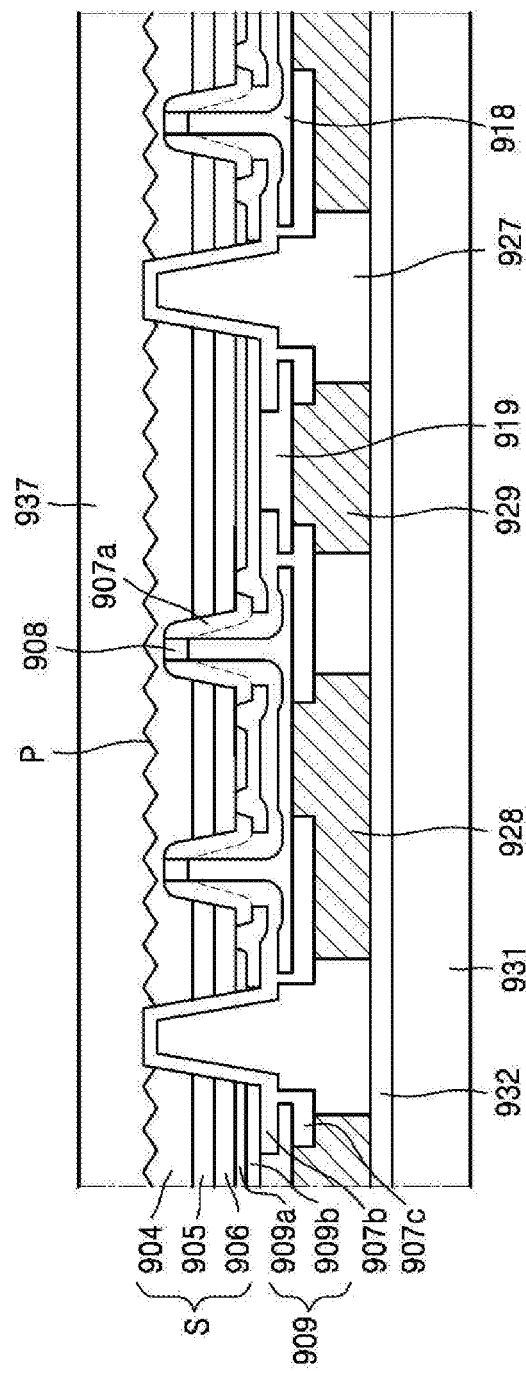

Referring to FIG. 13I, an optical wavelength conversion layer 937 may be formed on the light-emitting structure S. Various optical wavelength conversion materials, such as phosphors and/or quantum dots, may be used for the optical wavelength conversion layer 937.

Figure 13J:
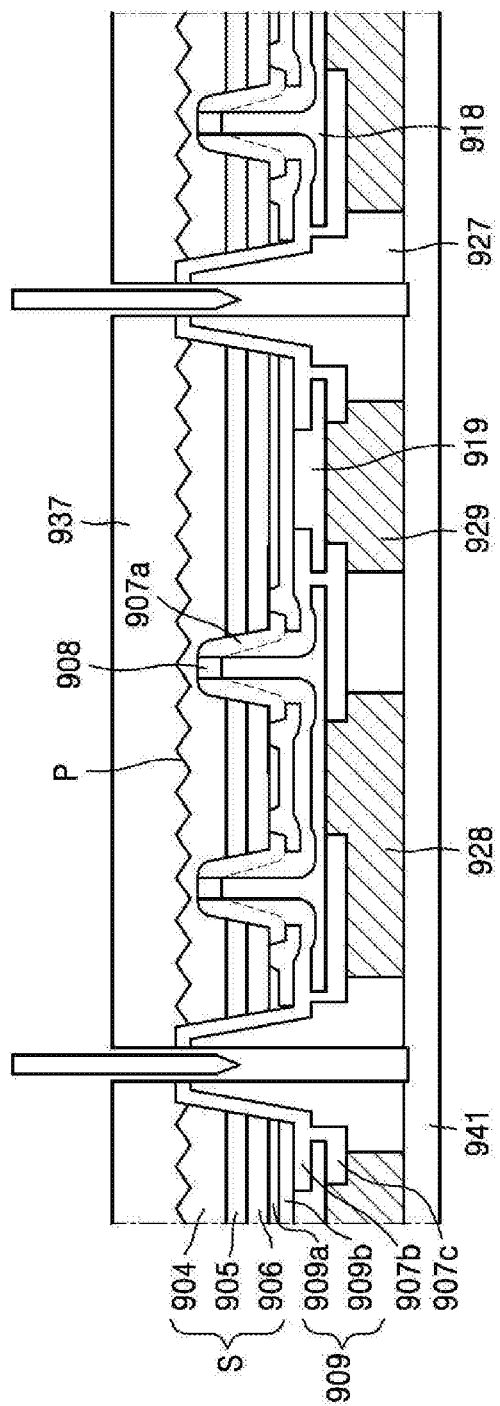

Referring to FIG. 13J, a process of cutting the light-emitting structure S for each individual package may be performed. In some embodiments, the cutting process may be performed by removing the support substrate 931, attaching an adhesive tape 941, and separating the light-emitting structure S into individual packages, for example, by blade cutting.

As shown in FIG. 12, a reflection layer 980 may be formed on the side of the optical wavelength conversion layer 937. The reflection layer 980 may cover only the side of the optical wavelength conversion layer 937. The reflection layer 980 may also cover the side of the lateral encapsulation 927.

On the other hand, aside from the above processes, FIG. 13K, an optical filter layer 960 may be formed on a transparent substrate 970. The optical filter layer 960 may reflect first light having a first peak wavelength which is emitted from the light-emitting structure S, and transmit second light having a second peak wavelength which is emitted from the optical wavelength conversion layer 937.

The transparent substrate 970 with the optical filter layer 960 formed thereon may be turned over and bonded to the optical wavelength conversion layer 937 as illustrated in FIG. 12. After the optical wavelength conversion layer 937 is semi-cured to have adhesive properties, the transparent substrate 970 may be pressed so that the optical filter layer 960 contacts the upper surface of the optical wavelength conversion layer 937. Then, the optical wavelength conversion layer 937 is cured. In this manner, the transparent substrate 970 with the optical filter layer 960 may be bonded to the optical wavelength conversion layer 937. Alternatively, the transparent substrate 970 with the optical filter layer 960 may be bonded to the optical wavelength conversion layer 937 by using an adhesive or an adhesive film. In some other embodiments, the transparent substrate 970 with the optical filter layer may be directly bonded to the optical wavelength conversion layer 937 without turning over the transparent substrate 970. That is, the transparent substrate 970 may directly contact the upper surface of the optical wavelength conversion layer 937.

As described above, in some embodiments, the transparent substrate 970 with the optical filter layer 960 may be cut into individual packages having the same size and bonded to the optical wavelength conversion layer 937. In some embodiments, the transparent substrate 970 with the optical filter layer 960 may be bonded to substantially the entire surface of the structure illustrated in FIG. 13I. Then, the resulting structure is cut into individual packages. The reflection layer 980 may be formed on the side of the cut individual packages.

The chip scale package obtained through the above-described processes has substantially the same package size as a semiconductor light-emitting device (i.e., LED chip). As a result, a large amount of light per unit area can be achieved. In addition, since all processes are performed at the wafer level, the inventive concept is suitable for mass production. Furthermore, the wavelength conversion material such as phosphors may be integrally prepared with the LED chip.

Figure 14:
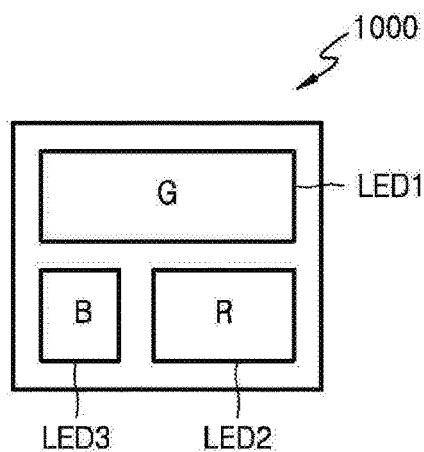
FIG. 14 is a block diagram of a three-color light-emitting apparatus using LEDs or LED packages according to various exemplary embodiments of the inventive concept.

FIG. 14 is a block diagram of a three-color light-emitting apparatus 1000 using LED packages LED1, LED2, and LED3 according to various exemplary embodiments of the inventive concept.

Referring to FIG. 14, the three-color light-emitting apparatus 1000 may include first, second, and third LED packages LED1, LED2, and LED3.

The first and second LED packages LED1 and LED2 may include any one of the LED packages or structures illustrated in FIGS. 1 to 12. The third LED package LED3 may not include an optical wavelength conversion layer and an optical filter layer. For example, the third LED package LED3 may be a modification of any one of the LED packages illustrated in FIGS. 1 to 12, from which the optical wavelength conversion layer and the optical filter layer are removed.

The first, second, and third LED packages LED1, LED2, and LED3 may have substantially the same light-emitting structure. For example, the configurations and material compositions of the light-emitting structures of the first, second, and third LED packages LED1, LED2, and LED3 may be substantially identical to one another. Each of the light-emitting structures of the first, second, and third LED packages LED1, LED2, and LED3 may emit first light having a first peak wavelength within a wavelength band of blue visible light. The light-emitting structure of the first LED package LED1 will be referred to as a first light-emitting structure, the light-emitting structure of the second LED package LED2 will be referred to as a second light-emitting structure, and the light-emitting structure of the third LED package LED3 will be referred to as a third light-emitting structure.

The first LED package LED1 may further include a first optical wavelength conversion layer and a first optical filter layer as compared with the third LED package LED3.

The first optical wavelength conversion layer may be disposed on the first light-emitting structure and be configured to absorb first light having a first peak wavelength, which is emitted from the first light-emitting structure, and emit second light having a second peak wavelength different from the first peak wavelength. The second peak wavelength may be included in a wavelength band of green visible light.

The first optical filter layer may be disposed on the first optical wavelength conversion layer and be configured to reflect the first light having the first peak wavelength which is emitted from the first light-emitting structure. The first optical filter layer may transmit the second light having the second peak wavelength which is emitted from the first optical wavelength conversion layer.

The second LED package LED2 may further include a second optical wavelength conversion layer and a second optical filter layer as compared with the third LED package LED3.

The second optical wavelength conversion layer may be disposed on the second light-emitting structure and be configured to absorb the first light having the first peak wavelength which is emitted from the second light-emitting structure, and emit a third light having a third peak wavelength different from the first peak wavelength and the second peak wavelength. The third peak wavelength may be included in a wavelength band of red visible light.

The second optical filter layer may be disposed on the second optical wavelength conversion layer and be configured to reflect the first light having the first peak wavelength which is emitted from the second light-emitting structure. The second optical filter layer may transmit the third light having the third peak wavelength which is emitted from the second optical wavelength conversion layer.

For example, the first LED package LED1 may output green light, the second LED package LED2 may output red light, and third LED package LED3 may output blue light.

Each of the first and second optical filter layers may have a structure in which a first dielectric film with a first refractive index and a second dielectric film with a second refractive index are alternately stacked. The first dielectric film and the second dielectric film provided in the first optical filter layer may have substantially the same dielectric constant and thickness as the first dielectric film and the second dielectric film provided in the second optical filter layer. According to another exemplary embodiment, the first dielectric film and the second dielectric film provided in the first optical filter layer may have a different dielectric constant and/or thickness from the first dielectric film and the second dielectric film provided in the second optical filter layer, so that the first optical filter layer transmits the second light having the second peak wavelength and the second optical filter layer transmits the third light having the third peak wavelength.

A planar area of the third light-emitting structure may be smaller than a planar area of the first light-emitting structure or the second light-emitting structure. Also, the planar area of the second light-emitting structure may be smaller than the planar area of the first light-emitting structure. In some embodiments, the planar area of the first light-emitting structure may be larger than the planar area of the first light-emitting structure or the second light-emitting structure. The first and second optical wavelength conversion layers and the first and second optical filter layers may be respectively disposed on the first and second light-emitting structures. Therefore, the light-emitting efficiency of the first and second LED packages LED1 and LED2 may be reduced by the wavelength conversion and the optical filtering, as compared with the third LED package LED3 that directly emit light without wavelength conversion or optical filtering. In order to compensate for the reduced light-emitting efficiency, the first and second LED packages LED1 and LED2 may have a larger planar area than the third LED package LED3.

According to the present exemplary embodiment, the first to third LED packages LED1 to LED3 of the three-color light-emitting apparatus 1000 may have the same light-emitting structure. Therefore, the first to third LED packages LED1 to LED3 may use the same driving power, and the three-color light-emitting apparatus 1000 may be driven even when only one type of power is supplied as the driving power of the three-color light-emitting apparatus 1000.

If the types of the light-emitting structures provided in the first, second and third LED packages LED1 to LED3 are different from one another to emit different color light, the driving powers thereof may need to be different from one another. In order to drive the three-color light-emitting apparatus including these first to third LED packages LED1 to LED3, it may be necessary to supply three different types of powers or to supply one type of power and additionally generate second and third powers through voltage division or the like. Thus, the efficiency of power may be degraded and the circuit may become complicated. With the present exemplary embodiment, however, since the first, second, and third LED packages LED1 to LED3 that emit different color light have the same light-emitting structure, the first, second and third LED packages LED1 to LED3 may be driven using one type of power and the power circuit may be simply configured. In addition, the power efficiency may not be reduced. Furthermore, it is possible to prevent color deviation by increasing the planar areas of the first and second LED packages LED1 and LED2 so as to solve the reduction in the light-emitting efficiency of the first and second LED packages LED1 and LED2.

In addition, with the present exemplary embodiment, the light of the first color is not included in the light emitted by the first and second LED packages LED1 and LED2. Therefore, the first and second LED packages LED1 and LED2 are capable of emitting high-purity light of second and third colors. Therefore, the three-color light-emitting apparatus 100 is capable of expressing a wide range of colors.

Figure 16:
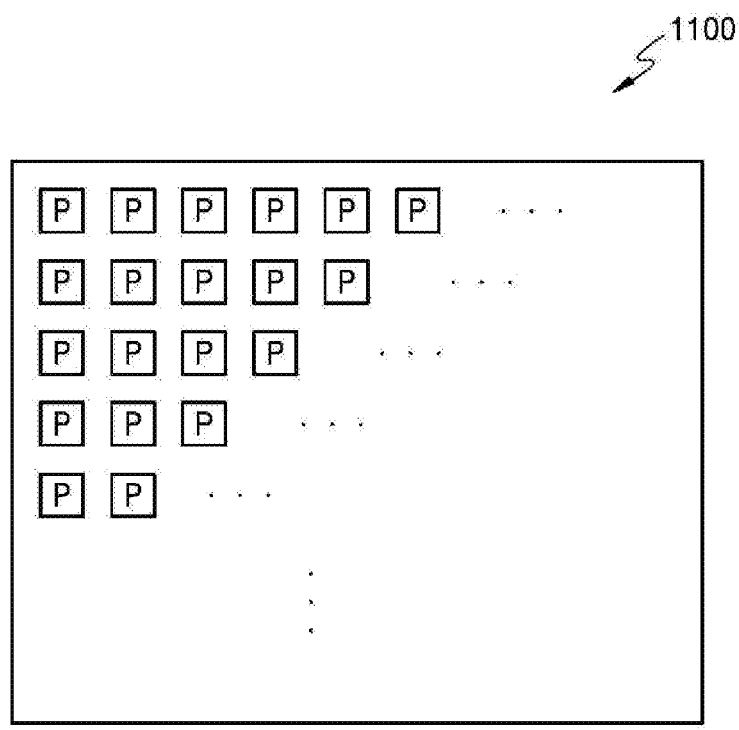
FIG. 16 is a block diagram of a display device using LEDs or LED packages according to various exemplary embodiments of the inventive concept.
Figure 17A:
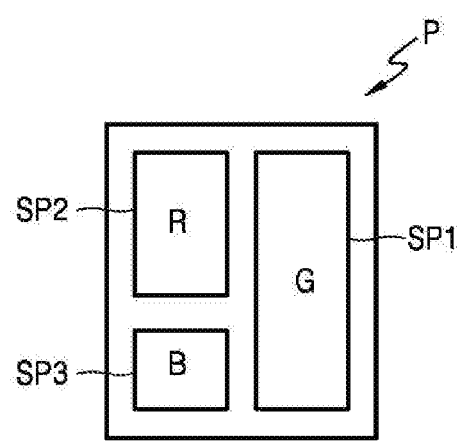
FIGS. 17A and 17B are block diagrams of pixels of the display device illustrated in FIG. 16.

FIG. 16 is a block diagram of a display device 1100 using LED packages according to various exemplary embodiments of the inventive concept. FIG. 17A is a block diagram of a pixel in the display device 1100 of FIG. 16.

Referring to FIGS. 16 and 17, the display device 1100 may include a plurality of pixels P. The pixels P may be arranged in rows and columns. The pixels P may be implemented by using the three-color light-emitting apparatus 1000 of FIG. 14 or may have a similar structure thereto.

The pixel P may include at least two subpixels SP. For example, if the subpixels SP are arranged in a Bayer pattern, a first pixel P may include red and green subpixels SP, a second pixel P may include blue and green subpixels SP, and the first pixel P and the second pixel P may be repeatedly arranged. The pixel P may include red, green, and blue subpixels SP. The pixel P may include red, green, blue, and white subpixels SP.

The pixel is illustrated in FIG. 17A as including first, second, and third subpixels SP1, SP2, and SP3, but the inventive concept is not limited thereto. For example, the pixel P can include four or more subpixels with different combinations of subpixels including red, green, blue and white subpixels SP. The first subpixel SP1 may include a first LED, the second subpixel SP2 may include a second LED, and the third subpixel SP3 may include a third LED.

The first LED may include a first light-emitting structure, a first optical wavelength conversion layer, and a first optical filter layer. The first light-emitting structure may include a first-conductivity-type semiconductor layer, an active layer, and a second-conductivity-type semiconductor layer and emit first light having a first peak wavelength. The first optical wavelength conversion layer may be disposed on the first light-emitting structure to absorb the first light having the first peak wavelength emitted from the first light-emitting structure, and emit second light having a second peak wavelength different from the first peak wavelength. The first optical filter layer may be disposed on the first optical wavelength conversion layer to reflect the first light emitted from the first light-emitting structure and transmit the second light emitted from the first optical wavelength conversion layer.

The second LED may include a second light-emitting structure, a second optical wavelength conversion layer, and a second optical filter layer. The second light-emitting structure may have substantially the same configuration and material composition as the first light-emitting structure, may include the first-conductivity-type semiconductor layer, the active layer, and the second-conductivity-type semiconductor layer, and emit first light having a first peak wavelength. The second optical wavelength conversion layer may be disposed on the second light-emitting structure to absorb the first light having the first peak wavelength emitted from the second light-emitting structure, and emit a third light having a third peak wavelength different from the first and second peak wavelengths. The second optical filter layer may be disposed on the second optical wavelength conversion layer to reflect the first light emitted from the second light-emitting structure and transmit the third light emitted from the second optical wavelength conversion layer.

The third LED may have a third light-emitting structure that includes the first-conductivity-type semiconductor layer, the active layer, and the second-conductivity-type semiconductor layer and emits the first light having the first peak wavelength.

The first, second, and third light-emitting structures of the first, second, and third subpixels SP1, SP2, and SP3 may have substantially the same configuration in size and material composition. For example, the first, second, and third light-emitting structures may be driven by using the same driving power and emit first light of the same color. A color of the first light may be a blue color. That is, the first peak wavelength may be included in a wavelength band of blue visible light. The second peak wavelength may be included in a wavelength band of a second color, for example, a wavelength band of green visible light. The third peak wavelength may be included in a wavelength band of a third color, for example, a wavelength band of red visible light.

As illustrated in FIG. 17A, the first LED of the first subpixel SP1 may emit green light, the second LED of the second subpixel SP2 may emit red light, and the third LED of the third subpixel SP3 may emit blue light.

Unlike the first and second subpixels SP1 and SP2, the third subpixel SP3 may not include the optical wavelength conversion layer and the optical filter layer. Therefore, the third subpixel SP3 may have higher light-emitting efficiency than the first and second subpixels SP1 and SP2. In order for the first, second, and third subpixels SP1, SP2, and SP3 to have the same maximum brightness, the planar areas of the first and second subpixels SP1 and SP2 may be larger than the planar area of the third subpixel SP3. In other words, in some embodiments, the planar area of the third subpixel SP3 among the first to third subpixels SP1, SP2, and SP3 may be smallest.

Figure 18:
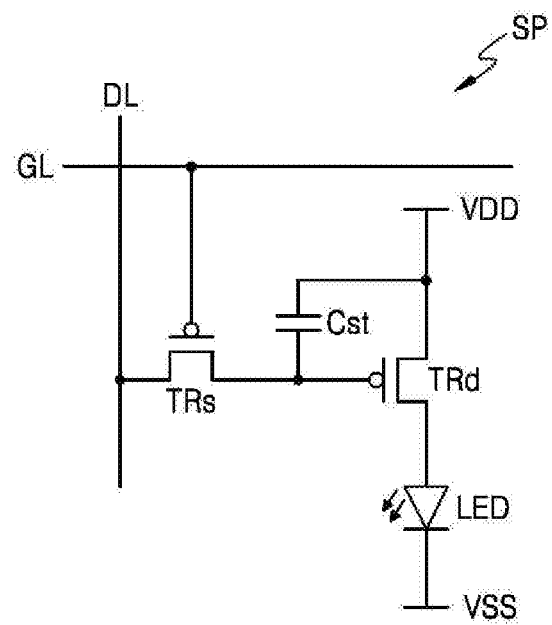
FIG. 18 is a circuit diagram of a subpixel illustrated in FIG. 17A.

However, since the first, second and third subpixels SP1, SP2, and SP3 include the light-emitting structure having substantially the same configuration in size and material composition, the first, second and third subpixels SP1, SP2, and SP3 may be driven by the same driving power. Therefore, the first, second, and third subpixels SP1, SP2, and SP3 may have the same driving circuit configuration. An example of a driving circuit of the subpixel P is illustrated in FIG. 18. The first to third subpixels SP1, SP2, and SP3 will be collectively referred to as a subpixel SP.

Figure 17B:
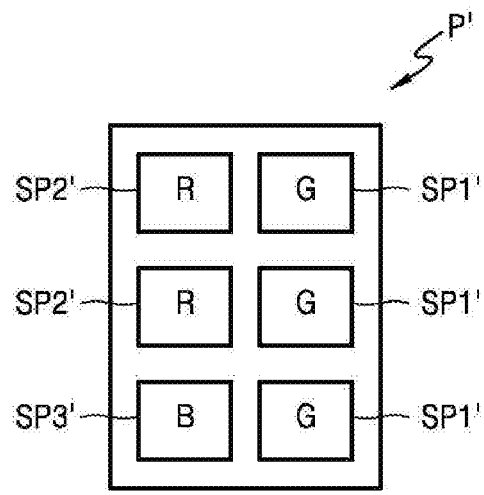

In some other embodiments, the planar areas of the subpixels SP1, SP2, and SP3 may be substantially the same. For example, as shown in FIG. 17B, first, second, and third subpixels SP1, SP2 and SP3 may each have substantially the same planar area. Similar to the pixel P of FIG. 17A, in the pixel P' of FIG. 17B, a first LED of the first subpixel SP1' may emit green light, a second LED of the second subpixel SP2' may emit red light, and a third LED of the third subpixel SP3' may emit blue light. The first LED may include a first light-emitting structure. The second LED may include a second light-emitting structure. The third LED may include a third light-emitting structure.

As a result, in some embodiments, the resulting pixel P' shown in FIG. 17B may comprise two or more first subpixel SP1' each having a first light-emitting structure, two or more second subpixels SP2 each having a second light-emitting structure, a single third subpixel SP3 having a third light-emitting structure. The first, second, and third light-emitting structures each include a first-conductivity-type semiconductor layer, an active layer, and a second-conductivity-type semiconductor layer and configured to emit first light having a first peak wavelength as in the above-described embodiments.

Also, other elements may be similarly formed as in the above-described embodiments. For example, a first optical wavelength conversion layer (not illustrated) may be disposed on the first light-emitting structure and configured to absorb the first light emitted from the first light-emitting structure and emit second light having a second peak wavelength different from the first peak wavelength. Also, a second optical wavelength conversion layer (not illustrated) may be disposed on the second light-emitting structure and configured to absorb the first light emitted from the second light-emitting structure and emit a third light having a third peak wavelength different from the first and second peak wavelength. Further, first and second optical filter layers (not illustrated) may be respectively disposed on the first and second optical wavelength conversion layers.

In some embodiments, an optical wavelength conversion layer may not be formed on the third light-emitting structure. Also, an optical filter layer may not be formed on the optical wavelength conversion layer overlying the third light-emitting structure.

In some embodiments, each of the first, second and third light-emitting structures have substantially the same planar area.

As in the pixel of FIG. 17A, the first LED of the first subpixel SP1 may emit green light. The second LED of the second subpixel SP2 may emit red light and the third LED of the third subpixel SP3 may emit blue light.

FIG. 18 is a circuit diagram of the subpixel SP illustrated in FIG. 17A.

Referring to FIG. 18, the subpixel SP may include a switching transistor TRs, a driving transistor TRd, and a storage capacitor Cst. The driving transistor TRd may generate a driving current between a first driving power VDD and a second driving power VSS and output the generated driving current to an LED. The LED may include one of the first to third light-emitting structures. As described above, since the first to third light-emitting structures are driven by the same driving power, the pixel circuit and the voltage level of the driving power do not change according to the type of the subpixel SP.

The switching transistor TRs may be connected to a gate line GL through which a scan signal is transmitted and a data line DL through which a data signal is transmitted. The switching transistor TRs may store the data signal in the storage capacitor Cst in response to the scan signal. The storage capacitor Cst may temporarily store the data signal transferred from the switching transistor TRs and constantly maintain a gate-source voltage of the driving transistor TRd during one frame. The driving transistor TRd may adjust an amount of a current flowing from the first driving power VDD to the second driving power VSS through the LED in response to the data signal transferred from the switching transistor TRs. Accordingly, the LED may emit light at a brightness corresponding to the data signal.

As illustrated in FIG. 18, since the subpixel SP is driven by the same driving power, regardless of the color to be displayed, the pixel circuit and the power circuit can be simplified. In addition, since each subpixel SP emits high-purity color light, the display device 1100 according to the present exemplary embodiment may display a wide range of colors.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items. Expressions such as "at least one of", when preceding a list of elements, modify the entire list of elements and do not modify the individual elements of the list.

Also, though terms "first" and "second" are used to describe various members, components, regions, layers, and/or portions in various embodiments of the inventive concept, the members, components, regions, layers, and/or portions are not limited to these terms. These terms are used only to differentiate one member, component, region, layer, or portion from another one. Therefore, a member, a component, a region, a layer, or a portion referred to as a first member, a first component, a first region, a first layer, or a first portion in an embodiment may be referred to as a second member, a second component, a second region, a second layer, or a second portion in another embodiment.

Spatially relative terms, such as "above", "upper", "beneath", "below", "lower", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a", "an", and "the" are intended to include the plural forms as well, unless the context clearly indicates otherwise. It will be understood that terms such as "comprise", "include", and "have", when used herein, specify the presence of stated features, integers, steps, operations, elements, components, or combinations thereof, but do not preclude the presence or addition of one or more other features, integers, steps, operations, elements, components, or combinations thereof.

While the inventive concept has been particularly shown and described with reference to exemplary embodiments thereof, it will be understood that various changes in form and details may be made therein without departing from the spirit and scope of the following claims.

What is claimed is:

1. A multi-color light-emitting apparatus comprising:
   first, second, and third light-emitting structures each including a first-conductivity-type semiconductor layer, a second-conductivity-type semiconductor layer, and an active layer between the first and second-conductivity-type semiconductor layers;
   a first optical wavelength conversion layer on an upper surface of the first-conductivity-type semiconductor layer of the first light-emitting structures;
   a first optical filter layer on an upper surface of the first optical wavelength conversion layer;
   a reflection layer on a lateral surface of the first optical wavelength conversion layer;
   a first electrode electrically connected to the first-conductivity-type semiconductor layer;
   a second electrode arranged on a lower surface of the second-conductivity-type semiconductor layer and electrically connected to the second-conductivity-type semiconductor layer, wherein lateral surfaces of the first optical filter layer and the reflection layer are substantially coplanar;
   a first metal post and a second metal post arranged on and connected to the first electrode and the second electrode, respectively; and
   a lateral encapsulation arranged between the first metal post and the second metal post and insulating the first metal post from the second metal post,
   wherein the lateral encapsulation is spaced apart from the first-conductivity-type semiconductor layer and the second-conductivity-type semiconductor layer.

2. The multi-color light-emitting apparatus of claim 1, wherein a planar area of the third light-emitting structure is smaller than a planar area of the first light-emitting structure or the second light-emitting structure.

3. The multi-color light-emitting apparatus of claim 1, further comprising a transparent substrate on the first optical filter layer.

4. The multi-color light-emitting apparatus of claim 1, wherein configurations of the first, second, and third light-emitting structures are substantially identical to one another.

5. The multi-color light-emitting apparatus of claim 1,
wherein the first optical filter layer has a multi-layer structure including first and second dielectric films arranged alternately,
wherein the first dielectric film has a first refractive index and a first thickness and the second dielectric film has a second refractive index and a second thickness.

6. The multi-color light-emitting apparatus of claim 1,
wherein the first, second, and third light-emitting structures are configured to emit light included in a blue visible light wavelength band.

7. The multi-color light-emitting apparatus of claim 1, further comprising a second optical wavelength conversion layer containing a material different from a material contained in the first optical wavelength conversion layer and arranged on an upper surface of the first-conductivity-type semiconductor layer of the second light-emitting structure.

8. The multi-color light-emitting apparatus of claim 7, further comprising a second optical filter layer on the second optical wavelength conversion layer.

9. The multi-color light-emitting apparatus of claim 8,
wherein a thickness of the second optical filter layer is different from a thickness of the first optical filter layer.

10. The multi-color light-emitting apparatus of claim 8,
wherein a dielectric constant of at least a portion of the second optical filter layer is different from a dielectric constant of at least a portion of the first optical filter layer.

11. A display device comprising:
a plurality of pixels each including:
a first subpixel having a first LED, wherein the first LED includes:
 a first light-emitting structure including a first-conductivity-type semiconductor layer, a second-conductivity-type semiconductor layer and an active layer disposed between the first and second-conductivity-type semiconductor layers;
 a first optical wavelength conversion layer on an upper surface of the first-conductivity-type semiconductor layer;
 a first optical filter layer on the first optical wavelength conversion layer;
 a reflection layer on a lateral side of the first optical wavelength conversion layer;
 a first electrode configured to be electrically connected to the first-conductivity-type semiconductor layer;
 a second electrode arranged on a lower surface of the second-conductivity-type semiconductor layer and configured to be electrically connected to the second-conductivity-type semiconductor layer,
 wherein lateral surfaces of the first optical filter layer and the reflection layer are substantially coplanar;
 a first metal post and a second metal post arranged on and connected to the first electrode and the second electrode, respectively; and
 a lateral encapsulation arranged between the first metal post and the second metal post and insulating the first metal post from the second metal post,
 wherein the lateral encapsulation is spaced apart from the first-conductivity-type semiconductor layer and the second-conductivity-type semiconductor layer.

12. The display device of claim 11,
wherein each of the plurality of pixels comprises a second subpixel having a second LED different from the first LED.

13. The display device of claim 11,
wherein each of the plurality of pixels comprises a third subpixel having a third LED different from the first and second LEDs.

14. The display device of claim 11, wherein the first LED is configured to emit green light and the second LED is configured to emit red light.

15. The display device of claim 11, further including a transparent substrate on the first and second optical filter layers.

16. The display device of claim 11, wherein a configuration of the first light-emitting structure and a configuration of the second light-emitting structure is substantially identical to one another.

17. The display device of claim 11, wherein the first optical filter layer has a multi-layer structure including first and second dielectric films arranged alternately, and wherein the first dielectric film has a first refractive index and a first thickness and the second dielectric film has a second refractive index and a second thickness.

18. A multi-color light-emitting apparatus comprising:
first, second, and third light-emitting structures each including a first-conductivity-type semiconductor layer, a second-conductivity-type semiconductor layer, and an active layer between the first and second-conductivity-type semiconductor layers;
a first optical wavelength conversion layer on an upper surface of the first-conductivity-type semiconductor layer of the first light-emitting structures;
a first optical filter layer on an upper surface of the first optical wavelength conversion layer;
a reflection layer on a lateral surface of the first optical wavelength conversion layer;
a first electrode electrically connected to the first-conductivity-type semiconductor layer;
a second electrode arranged on a lower surface of the second-conductivity-type semiconductor layer and electrically connected to the second-conductivity-type semiconductor layer, wherein outer lateral surfaces of the first optical filter layer and the reflection layer are substantially coplanar;
a first metal post and a second metal post arranged on and connected to the first electrode and the second electrode, respectively; and
a lateral encapsulation arranged between and the first and second electrodes, wherein outer lateral surfaces of the first optical wavelength conversion layer and the lateral encapsulation are substantially coplanar.

19. The multi-color light-emitting apparatus of claim 18,
wherein the lateral encapsulation provides electrical insulation between the first metal post and the second metal post.

20. The multi-color light-emitting apparatus of claim 18,
wherein a planar area of the third light-emitting structure is smaller than a planar area of the first light-emitting structure or the second light-emitting structure.

* * * * *